(12) United States Patent
Levermore et al.

(10) Patent No.: US 8,334,545 B2
(45) Date of Patent: Dec. 18, 2012

(54) OLED DISPLAY ARCHITECTURE

(75) Inventors: Peter Levermore, Lambertville, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 204 days.

(21) Appl. No.: 12/852,999

(22) Filed: Aug. 9, 2010

(65) Prior Publication Data

US 2011/0233528 A1    Sep. 29, 2011

Related U.S. Application Data

(60) Provisional application No. 61/340,932, filed on Mar. 24, 2010.

(51) Int. Cl.
*H01L 29/18* (2006.01)
*H01L 33/00* (2010.01)

(52) U.S. Cl. ............. 257/88; 257/40; 257/E33.013; 438/35; 313/504

(58) Field of Classification Search .......... 257/40, 257/88, E33.013; 438/35; 313/504
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |

(Continued)

FOREIGN PATENT DOCUMENTS

EP    1052708    11/2000

(Continued)

OTHER PUBLICATIONS

Baldo et al., "Highly Efficient Phosphorescent Emission from Organic Electroluminescent Devices," Nature, vol. 395, 151-154, 1998.

(Continued)

*Primary Examiner* — Steven J Fulk
(74) *Attorney, Agent, or Firm* — Kilpatrick Townsend & Stockton LLP

(57) ABSTRACT

A quad pixel device is provided. Each pixel is an organic light emitting device (OLED), such that there is a first, second, third and fourth OLED. Each of the first, second, third and fourth OLEDs independently has a first electrode and a second electrode. Each OLED also independently has an organic emissive stack having an emitting material, disposed between the first and second electrodes; a first organic stack disposed between and in contact with the first electrode and the emissive stack; and a second organic stack disposed between and in contact with the second electrode and the emissive layer. The organic emissive stack of the first OLED, the organic emissive stack of the second OLED, the organic emissive stack of the third OLED, and the organic emissive stack of the fourth OLED each have different emissive spectra. The first organic stack of the first OLED, the first organic stack of the second OLED, and the first organic stack of the third OLED are different from each other in materials or thickness, or both. The first organic stack of the third OLED and the first organic stack of the fourth OLED are the same.

35 Claims, 14 Drawing Sheets

U.S. PATENT DOCUMENTS

| | | | |
|---|---|---|---|
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,366,025 | B1 | 4/2002 | Yamada |
| 6,468,819 | B1 | 10/2002 | Kim et al. |
| 6,747,618 | B2 | 6/2004 | Arnold et al. |
| 6,771,028 | B1 | 8/2004 | Winters |
| 7,091,986 | B2 | 8/2006 | Phan |
| 7,215,347 | B2 | 5/2007 | Phan |
| 7,279,704 | B2 | 10/2007 | Walters et al. |
| 7,431,968 | B1 | 10/2008 | Shtein et al. |
| 2002/0186214 | A1 | 12/2002 | Siwinski |
| 2003/0042848 | A1 | 3/2003 | Park et al. |
| 2003/0230980 | A1 | 12/2003 | Forrest et al. |
| 2004/0032205 | A1 | 2/2004 | Hack et al. |
| 2004/0113875 | A1 | 6/2004 | Miller et al. |
| 2004/0174116 | A1 | 9/2004 | Lu et al. |
| 2004/0201558 | A1 | 10/2004 | Arnold et al. |
| 2004/0217694 | A1* | 11/2004 | Cok et al. ............ 313/504 |
| 2005/0040756 | A1* | 2/2005 | Winters et al. ......... 313/504 |
| 2005/0258433 | A1 | 11/2005 | Djurovich et al. |
| 2006/0138418 | A1 | 6/2006 | Lee et al. |
| 2007/0001584 | A1 | 1/2007 | Lee et al. |
| 2007/0015429 | A1 | 1/2007 | Maeda et al. |
| 2007/0164664 | A1 | 7/2007 | Ludwicki et al. |
| 2007/0200495 | A1 | 8/2007 | Kai et al. |
| 2007/0222367 | A1 | 9/2007 | Hosoda et al. |
| 2007/0236135 | A1* | 10/2007 | Fukuda et al. ......... 313/503 |
| 2008/0030833 | A1* | 2/2008 | Park ................. 359/259 |
| 2008/0203905 | A1 | 8/2008 | Je et al. |
| 2008/0204366 | A1* | 8/2008 | Kane et al. ............ 345/44 |
| 2008/0224968 | A1 | 9/2008 | Kashiwabara |
| 2009/0261715 | A1 | 10/2009 | Sung et al. |
| 2010/0013378 | A1 | 1/2010 | Andrade |
| 2010/0090241 | A1 | 4/2010 | D'Andrade et al. |
| 2010/0090620 | A1 | 4/2010 | Hack et al. |

FOREIGN PATENT DOCUMENTS

| | | |
|---|---|---|
| EP | 1770676 | 4/2007 |
| JP | 2006004758 | 1/2006 |
| JP | 2007-122033 | 5/2007 |
| JP | 2007-123065 | 5/2007 |
| WO | WO 2009/107596 | 9/2009 |

OTHER PUBLICATIONS

Baldo et al., "Very high-efficiency green organic light-emitting devices based on electrophosphorescence," Appl. Phys. Lett., vol. 75, No. 3, 4-6 (1999).

M. S. Weaver et al., "Phosphorescent OLED-s for displays and lighting," UDC, Proceedings of the International Display Manufacturing Conference, pp. 328-331 (2007).

B. D'Andrade et al., "Blue phosphorescent organic light emitting device stability analysis," UDC, Society for Information Display Digest of Technical Papers 34, 2, pp. 712-715 (2008).

Funahashi et al., "Highly efficient fluorescent deep blue dopant for "Super Top Emission" Device," Society for Information Display Digest of Technical Papers 47. 3, pp. 709-711 (2008).

Baek-woon Lee et al., "Micro-cavity design of RGBW AMOLED for 100% color gamut," Society for Information Display Digest of Technical Papers 68.4, pp. 1050-1053 (2008).

A. Arnold, T. K. Hatwar, M. Hettel, P. Kane, M. Miller, M. Murdoch, J. Spindler, S. V. Slyke, Proc. Asia Display (2004).

J. P. Spindler et al., "Lifetime- and power-enhanced RGBW displays based on white OLEDs," SID 2005 International Symposium Technical Digest 36, 1, pp. 36-39 (2005).

Du-Zen Peng, et al, "Challenges for small- and medium-sized AMOLED displays," Information Display 23, 2, pp. 12-18 (2007).

B-W. Lee et al. "Late-News Paper: TFT-LCD with RGBW Color System" SID 03 Digest, pp. 1212-1215 (2003).

The International Search Report corresponding to the PCT/US2009/059202 application, (2009).

The International Search Report corresponding to the PCT/US2010/029796 application, (2010).

The International Search Report and Written Opinion corresponding to the PCT/US2009/068505 application, (2010).

The International Search Report and Written Opinion corresponding to the PCT/US2011/028998 application, (2011).

Ishibashi et al., "Active matrix organic light emitting diode display based on "Super Top Emission" Technology", Jpn. J. of Appl. Phys., vol. 45, No. 5B (2006) pp. 4392-4395.

Jiun-Haw Lee et al., Journal of the Electrochemical Society, 154 (7) J226-J228 (2007).

Franky So , "Organic Electronics: Materials, Processing, Devices and Applications", CRC Press, p. 448-p. 449 (2009).

Woo-Young So et al., "Power Efficient AMOLED Display with Novel Four Sub-Pixel Architecture and Driving Scheme" paper 44.3, SID Digest (2010).

U.S. Appl. No. 61/101,757, filed Oct. 1, 2008.
U.S. Appl. No. 12/565,115, filed Sep. 23, 2009.
U.S. Appl. No. 12/752,792, filed Apr. 1, 2010.
U.S. Appl. No. 61/164,667, filed Mar. 30, 2009.
U.S. Appl. No. 12/639,541, filed Dec. 16, 2009.

* cited by examiner

OLED DISPLAY ARCHITECTURE

This application claims priority from U.S. provisional application 61/340,932, filed Mar. 24, 2010, and is related to U.S. Patent Applications: 61/101,757, filed Oct. 1, 2008; Ser. No. 12/565,115, filed Sep. 23, 2009; Ser. No. 12/752,792, filed Apr. 1, 2010; 61/164,667, filed Mar. 30, 2009 and Ser. No. 12/639,541, filed Dec. 16, 2009; and United States Patent Publication US-2010-0090620, published Apr. 15, 2010, all of which are incorporated by reference in their entireties.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to the use of both light and deep blue organic light emitting devices to render color.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for organic emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

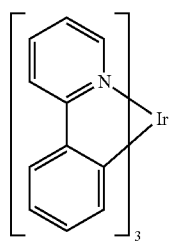

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A device is provided. The device includes a quad pixel, which means the device has at least four separate pixels or sub-pixels. Each pixel is an organic light emitting device (OLED), such that there is a first, second, third and fourth OLED. Each of the first, second, third and fourth OLEDs independently has a first electrode and a second electrode. Each OLED also independently has an organic emissive stack having an emitting material, disposed between the first and second electrodes; a first organic stack disposed between and in contact with the first electrode and the emissive stack; and a second organic stack disposed between and in contact with the second electrode and the emissive layer. The organic emissive stack of the first OLED, the organic emissive stack of the second OLED, the organic emissive stack of the third OLED, and the organic emissive stack of the fourth OLED each have different emissive spectra. The first organic stack of the first OLED, the first organic stack of the second OLED, and the first organic stack of the third OLED are different from each other in materials or thickness, or both. The first organic stack of the third OLED and the first organic stack of the fourth OLED are the same.

In one embodiment, the first electrode is an anode and the OLED is a bottom emitting OLED for each of the first OLED, the second OLED, the third OLED and the fourth OLED.

In one embodiment, the first electrode is an anode and the OLED is a top emitting OLED for each of the first OLED, the second OLED, the third OLED and the fourth OLED.

In one embodiment, the first electrode is a cathode and the OLED is a bottom emitting OLED for each of the first OLED, the second OLED, the third OLED and the fourth OLED.

In one embodiment, the first electrode is a cathode and the OLED is a top emitting OLED for each of the first OLED, the second OLED, the third OLED and the fourth OLED.

In one embodiment, the second organic stack is the same in each of the first OLED, the second OLED, the third OLED and the fourth OLED.

In one embodiment, the second organic stack is different in each of the first OLED, the second OLED, the third OLED and the fourth OLED.

In one embodiment, each of the first, second, third and fourth OLEDs has a single emissive material, different from the emissive material of each of the other OLEDs. The emitting material of the first OLED emits light having a peak wavelength in the visible spectrum of 600-700 nm, and is a phosphorescent material. The emitting material of the second OLED emits light having a peak wavelength in the visible spectrum of 500-600 nm, and is a phosphorescent material. The emitting material of the third OLED emits light having a peak wavelength in the visible spectrum of 400-500 nm. The emitting material of the fourth OLED emits light having a peak wavelength in the visible spectrum of 400-500 nm. The peak wavelength in the visible spectrum of light emitted by the fourth organic light emitting device is at least 4 nm less than the peak wavelength in the visible spectrum of light emitted by the third organic light emitting device. The emitting materials of the third OLED and the fourth OLED may be any combination of phosphorescent and fluorescent materials. Both may be phosphorescent materials, both may both be fluorescent materials, or one may be fluorescent and other may be phosphorescent. For example, the emitting material of the third OLED may be a phosphorescent material and the emitting material of the fourth OLED may be a fluorescent material.

In one embodiment, each of the first, second, third and fourth OLEDs has an organic emissive stack that emits a spectrum of light different from the spectrum emitted by the organic emissive stack of each of the other OLEDs. The organic emissive stack of the first OLED emits light having a peak wavelength in the visible spectrum of 600-700 nm, and includes a phosphorescent emitting material. The organic emissive stack of the second OLED emits light having a peak wavelength in the visible spectrum of 500-600 nm, and includes a phosphorescent emitting material. The organic emissive stack of the third OLED emits light having a peak wavelength in the visible spectrum of 400-500 nm. The organic emissive stack of the fourth OLED emits light having a peak wavelength in the visible spectrum of 550-600 nm., and includes a phosphorescent emitting material. The peak wavelength in the visible spectrum of light emitted by the fourth organic light emitting device is at least 10 nm greater than the peak wavelength in the visible spectrum of light emitted by the second organic light emitting device, and at least 10 nm less than the peak wavelength in the visible spectrum of light emitted by the first organic light emitting device.

In one embodiment, the organic emissive stack of the fourth OLED includes an organic emissive layer of the fourth OLED, and the organic emissive layer of the fourth OLED is the same as, and is deposited at the same time as, a component of either the first or second organic stacks of the first, second and third OLEDs.

In one embodiment, the device is a consumer device that includes a plurality of quad pixels.

A method of depositing a device comprising a quad pixel is provided. The quad pixel includes a first OLED, a second OLED, a third OLED and a fourth OLED. Each OLED independently has an area of a substrate over which the OLED is disposed; a first electrode; a second electrode; an organic emissive stack having an emitting material, disposed between the first and second electrodes; a first organic stack disposed between and in contact with the first electrode and the emissive layer; and a second organic stack disposed between and in contact with the second electrode and the organic emissive stack. The organic emissive stack of the first OLED, the organic emissive stack of the second OLED, the organic emissive stack of the third OLED, and the organic emissive stack of the fourth OLED each have different emissive spectra. The first organic stack of the first OLED, the first organic stack of the second OLED, and the first organic stack of the third OLED are different from each other in materials or thickness or both. The method comprises depositing each component of the first organic stack of the third OLED at the same time as the same component in the first organic stack of the fourth OLED.

In one embodiment, during the deposition of the first organic stacks of the first, second, third and fourth OLEDs, there are at most two alignments of masks that allow deposition over some but not all of the areas of the first, second, third and fourth OLEDs, and the deposition of one or more components of the first organic stack of some but not all of the first, second, third and fourth OLEDs through each of the masks. There may be exactly two such alignments. Optionally, during the deposition of the first organic stacks of the first, second, third and fourth OLEDs, and prior to the deposition through two masks that allow deposition over some but not all of the first, second, third and fourth OLEDs, there is a deposition of one or more components of the first organic stacks of the first, second, third and fourth OLEDs. Optionally, during the deposition of the first organic stacks of the first, second, third and fourth OLEDs, and after the deposition through the two masks that allow deposition over some but not all of the first, second, third and fourth OLEDs, there is a deposition of one or more components of the first organic stacks of the first, second, third and fourth OLEDs.

In one embodiment, during the deposition of the quad pixel, there are at most six alignments of masks that allow deposition over some but not all of the areas of the first, second, third and fourth OLEDs, and the deposition of one or more components of the first, second, third and fourth OLEDs through each of the masks.

In one embodiment, one or more components of the first organic stack of each of the first, second, third and fourth OLEDs are deposited over the area of each of the first, second, third and fourth OLEDs. In addition, a mask is aligned that allows for deposition over the area of the second OLED and not the areas of the first, third and fourth OLEDs, and deposition is performed through the mask over the area of the second OLED and not over the area of the first, third and fourth OLEDs, of one or more components of the first organic stack of the second OLED. Also, a mask is aligned that allows for deposition over the area of the third and fourth OLEDs and not the areas of the first and second OLEDs, and deposition is performed through the mask over the area of the third and fourth OLEDs and not over the area of the first and second OLEDs, of one or more components of the first organic stack of the third and fourth OLEDs. These depositions, and the corresponding alignments, may be performed in the order described, or in a different order.

In one embodiment, one or more components of the first organic stack of each of the first, second, third and fourth OLEDs are deposited over the area of each of the first, second, third and fourth OLEDs. In addition, a mask is aligned that allows for deposition over the area of the second, third and fourth OLEDs and not the areas of the first OLED, and deposition is performed through the mask over the area of the second, third and fourth OLEDs and not over the area of the first OLED, of one or more components of the first organic stack of the second, third and fourth OLEDs. Also, a mask is aligned that allows for deposition over the area of the third and fourth OLEDs and not the areas of the first and second OLEDs, and deposition is performed through the mask over the area of the third and fourth OLEDs and not over the area of the first and second OLEDs, of one or more components of the first organic stack of the third and fourth OLEDs. These depositions, and the corresponding alignments, may be performed in the order described, or in a different order.

In one embodiment, one or more components of the first organic stack of each of the first, second, third and fourth OLEDs are deposited over the area of each of the first, second, third and fourth OLEDs. Also, a mask is aligned that allows for deposition over the area of the first and second OLEDs and not the areas of the third and fourth OLEDs, and deposition is performed through the mask over the area of the first and second OLEDs and not over the area of the third and fourth OLEDs, of one or more components of the first organic stack of the first and second OLEDs. In addition, a mask is aligned that allows for deposition over the area of the first OLED and not the areas of the second, third and fourth OLEDs, and deposition is performed through the mask over the area of the first OLED and not over the area of the second, third and fourth OLEDs, of one or more components of the first organic stack of the first OLED. These depositions, and the corresponding alignments, may be performed in the order described, or in a different order.

In one embodiment, one or more components of the first organic stack of each of the first, second, third and fourth OLEDs are deposited over the area of each of the first, second, third and fourth OLEDs. A mask is aligned that allows for deposition over the area of the first OLED and not the areas of the second, third and fourth OLEDs, and deposition is performed through the mask over the area of the first OLED and not over the area of the second, third and fourth OLEDs, of one or more components of the first organic stack of the first OLED. A mask is aligned that allows for deposition over the area of the second OLED and not the areas of the first, third and fourth OLEDs, and deposition is performed through the mask over the area of the second OLED and not over the area of the first, third and fourth OLEDs, of one or more components of the first organic stack of the first OLED. These depositions, and the corresponding alignments, may be performed in the order described, or in a different order.

In one embodiment of a method, for each of the first OLED, the second OLED, the third OLED and the fourth OLED: the first electrode is an anode; the second electrode is a cathode, and the OLED is a bottom emitting OLED. In addition to method steps described above, the method further includes: providing over the substrate the first electrode of each of the first, second, third and fourth OLEDs. For each of the first, second, third and fourth OLEDs, the following are deposited, in order, over the first electrode and over the previous stack: a first organic stack; an organic emissive stack, and a second organic stack, and a second electrode.

In one embodiment, for example further to the method described in the previous paragraph, depositing the first organic stack includes, for each of the first, second, third and fourth OLEDs, depositing in order: a hole injection layer and a hole transport layer. The hole injection layer for each of the first, second, third and fourth OLEDs are deposited at the same time. Multiple steps and different masks are used to deposit hole transport layers that are different for the first, second and third OLEDs. The hole transport layers of the third and fourth OLEDs are deposited at the same time.

In one embodiment, for example further to the method described in the previous paragraph, the emissive stack of each of the first, second, third and fourth OLEDs is deposited through a different mask and has a material composition different from each of the other emissive stacks.

In the broadest sense, various embodiments are directed to specific configurations and ways to deposit the first organic stacks of first, second, third and fourth OLEDs. Any of a variety of configurations and methods may be used for the corresponding emissive and second organic stacks.

In one embodiment, the emissive stack of at least one of the first, second, third and fourth OLEDs includes an emissive layer having a host and a dopant, and a blocking layer having the host and not the dopant.

In one embodiment, depositing the second organic stack includes, for each of the first, second, third and fourth OLEDs, depositing in order: an electron transport layer; and an electron injection layer. The electron injection layer for each of the first, second, third and fourth OLEDs are deposited at the same time. The electron transport layer for each of the first, second, third and fourth OLEDs are deposited at the same time. This embodiment is preferable used in combination with an emissive stack that includes a blocking layer.

In one embodiment, each layer of the second organic stack of each of the first, second, third and fourth OLEDs is deposited at the same time through the same mask.

In one embodiment, deposition of the second organic stack includes depositing an electron transport layer.

In one embodiment, depositing the second organic stack includes, for each of the first, second, third and fourth OLEDs, depositing in order: a blocking layer; an electron transport layer; and an electron injection layer. The blocking layer for each of the first, second, third and fourth OLEDs are deposited at the same time, and the electron injection layer for each of the first, second, third and fourth OLEDs are deposited at the same time. Multiple steps and different masks are used to deposit electron transport layers that are different for the first, second and third OLEDs. The electron transport layers of the third and fourth OLEDs are deposited at the same time.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
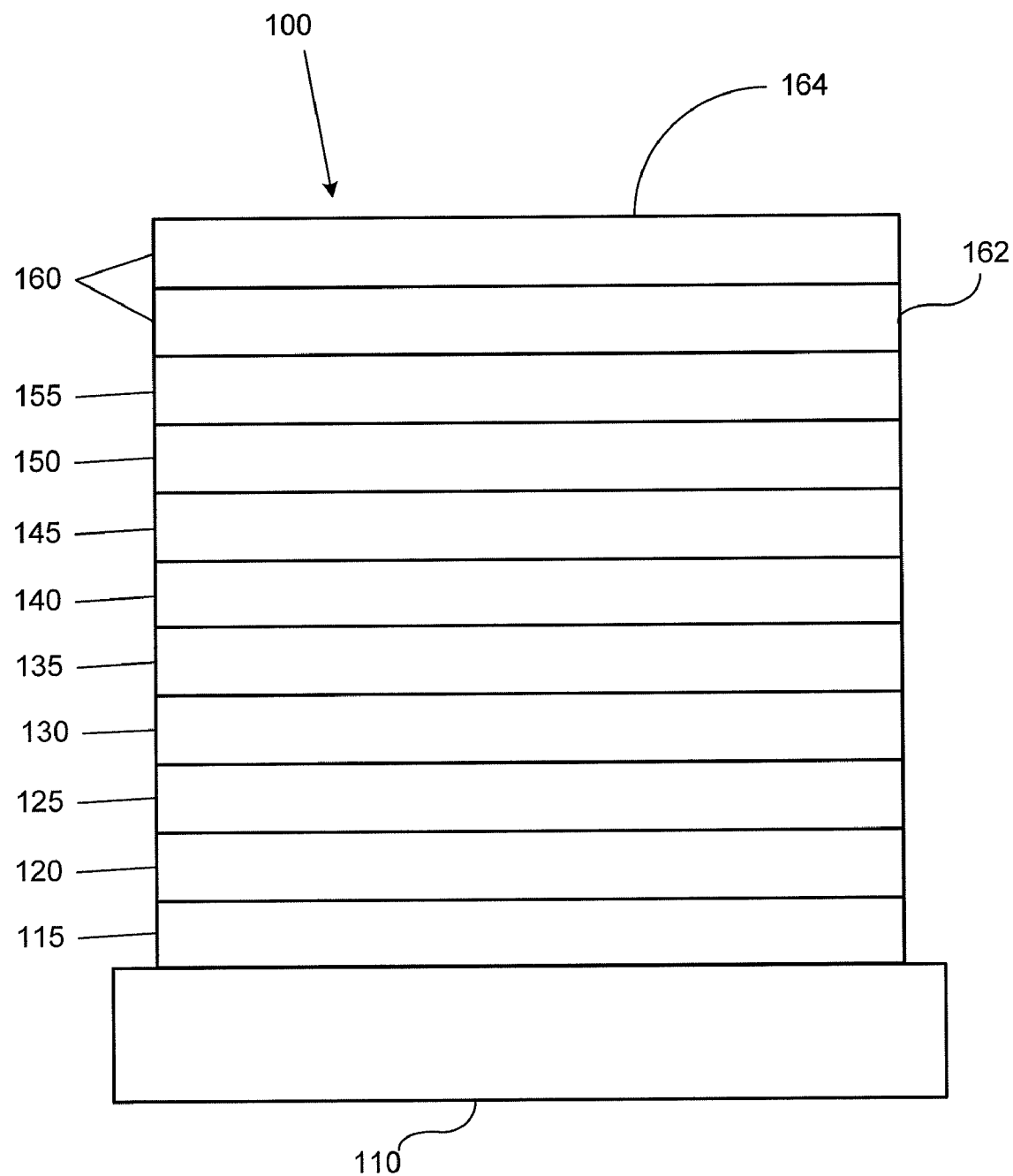
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
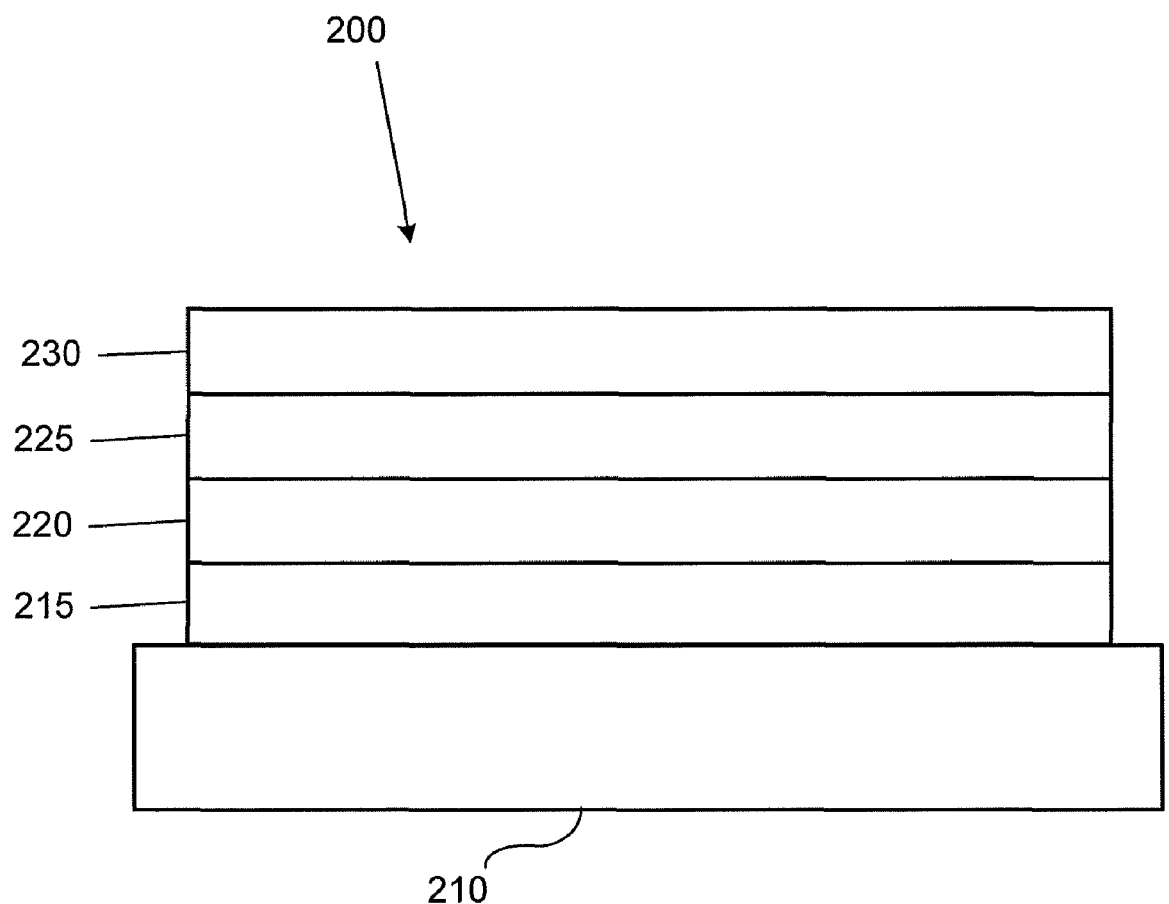
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One application for organic emissive molecules is a full color display, preferably an active matrix OLED (AMOLED) display. One factor that currently limits AMOLED display lifetime and power consumption is the lack of a commercial blue OLED with saturated CIE coordinates with sufficient device lifetime.

Figure 3:
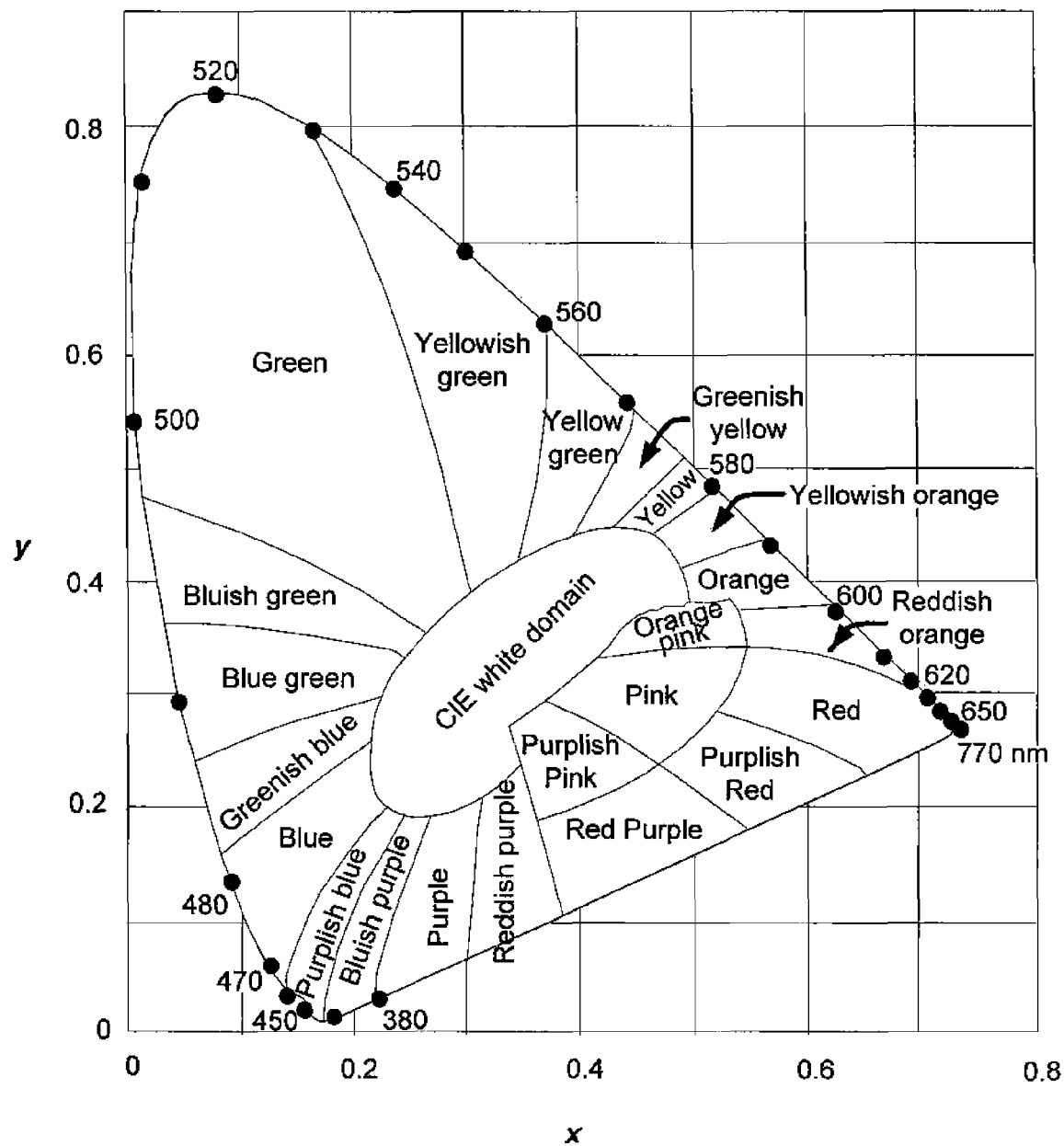
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 4:
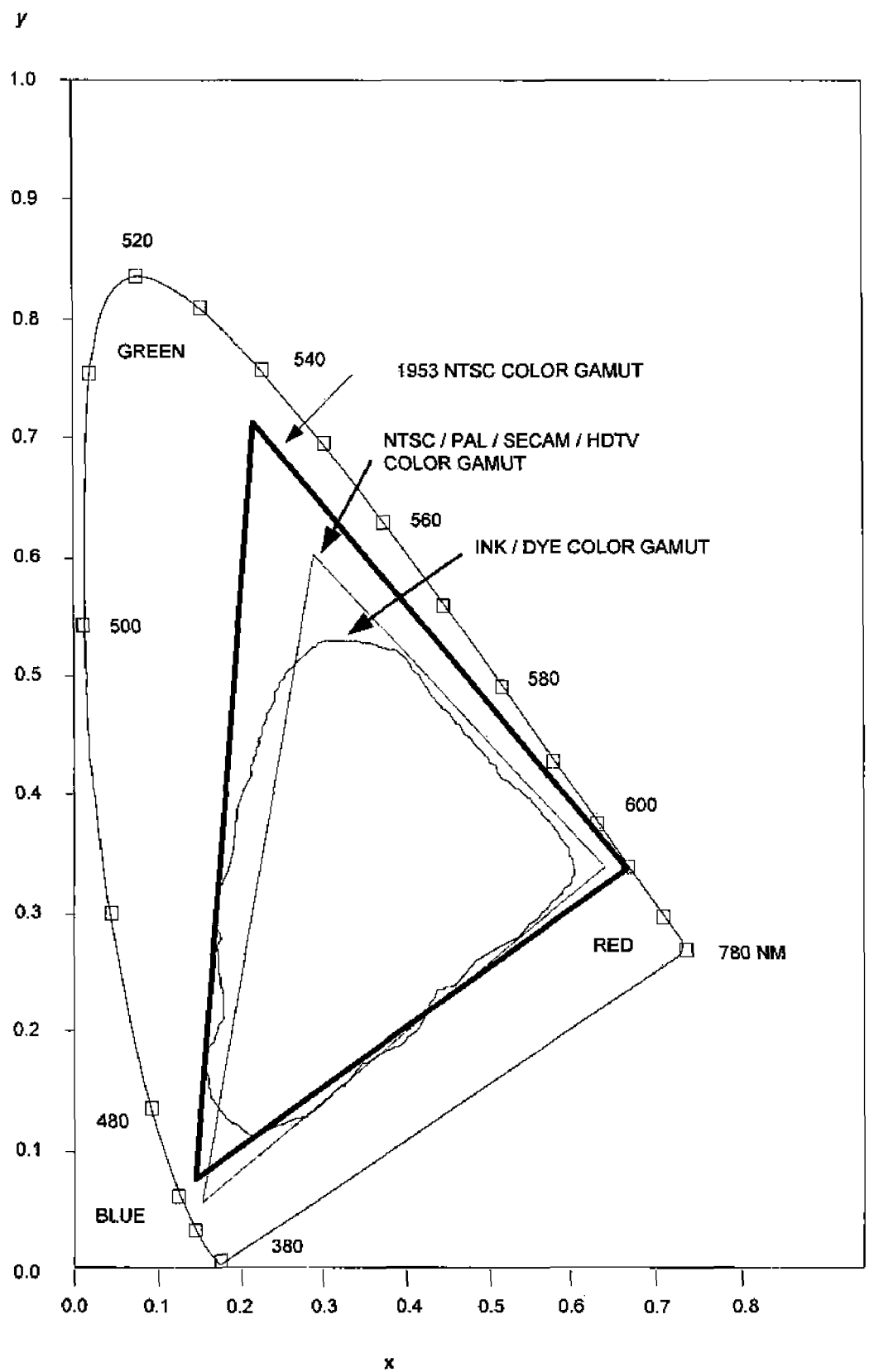
FIG. 4 shows a rendition of the 1931 CIE chromaticity diagram that also shows color gamuts.

FIG. 4 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 4 represent industry standard CIE coordinates for displays. For example, the three points of the triangle labeled "NTSC/PAL/SECAM/HDTV gamut" represent the colors of red, green and blue (RGB) called for in the sub-pixels of a display that complies with the standards listed. A pixel having sub-pixels that emit the RGB colors called for can render any color inside the triangle by adjusting the intensity of emission from each sub-pixel.

The CIE coordinates called for by NTSC standards are: red (0.67, 0.33); green (0.21, 0.72); blue (0.14, 0.08). There are devices having suitable lifetime and efficiency properties that are close to the blue called for by industry standards, but remain far enough from the standard blue that the display fabricated with such devices instead of the standard blue would have noticeable shortcomings in rendering blues. The blue called for industry standards is a "deep" blue as defined below, and the colors emitted by efficient and long-lived blue devices are generally "light" blues as defined below.

A display is provided which allows for the use of a more stable and long lived light blue device, while still allowing for the rendition of colors that include a deep blue component. This is achieved by using a quad pixel, i.e., a pixel with four devices. Three of the devices are highly efficient and long-lived devices, emitting red, green and light blue light, respectively. The fourth device emits deep blue light, and may be less efficient or less long lived that the other devices. However, because many colors can be rendered without using the fourth device, its use can be limited such that the overall lifetime and efficiency of the display does not suffer much from its inclusion.

A device is provided. The device has a first organic light emitting device, a second organic light emitting device, a third organic light emitting device, and a fourth organic light emitting device. The device may be a pixel of a display having four sub-pixels. A preferred use of the device is in an active matrix organic light emitting display, which is a type of device where the shortcomings of deep blue OLEDs are currently a limiting factor.

The first organic light emitting device emits red light, the second organic light emitting device emits green light, the third organic light emitting device emits light blue light, and the fourth organic light emitting device emits deep blue light. The peak emissive wavelength of the fourth device is at least 4 nm less than that of the third device. As used herein, "red" means having a peak wavelength in the visible spectrum of 600-700 nm, "green" means having a peak wavelength in the visible spectrum of 500-600 nm, "light blue" means having a peak wavelength in the visible spectrum of 400-500 nm, and "deep blue" means having a peak wavelength in the visible spectrum of 400-500 nm, where "light" and "deep" blue are distinguished by a 4 nm difference in peak wavelength. Preferably, the light blue device has a peak wavelength in the visible spectrum of 465-500 nm, and "deep blue" has a peak wavelength in the visible spectrum of 400-465 nm Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 465-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-465 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

More generally, "light blue" may mean having a peak wavelength in the visible spectrum of 400-500 nm, and "deep blue" may mean having a peak wavelength in the visible spectrum of 400-500 nm., and at least 4 nm less than the peak wavelength of the light blue.

In another embodiment, "light blue" may mean having a CIE y coordinate less than 0.25, and "deep blue" may mean having a CIE y coordinate at least 0.02 less than that of "light blue."

In another embodiment, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations. In any event, embodiments of the invention include two different blue pixels, however the difference in blue is measured.

The first, second, third and fourth organic light emitting devices each have an emissive layer that includes an organic material that emits light when an appropriate voltage is applied across the device. The emissive material in each of the first and second organic light emissive devices is a phosphorescent material. The emissive material in the third organic light emitting device is a fluorescent material. The emissive material in the fourth organic light emitting device may be either a fluorescent material or a phosphorescent material. Preferably, the emissive material in the fourth organic light emitting device is a phosphorescent material.

"Red" and "green" phosphorescent devices having lifetimes and efficiencies suitable for use in a commercial display are well known and readily achievable, including devices that emit light sufficiently close to the various industry standard reds and greens for use in a display. Examples of such devices are provided in M. S. Weaver, V. Adamovich, B. D'Andrade, B. Ma, R. Kwong, and J. J. Brown, Proceedings of the International Display Manufacturing Conference, pp. 328-331 (2007); see also B. D'Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

An example of a light blue fluorescent device is provided in Jiun-Haw Lee, Yu-Hsuan Ho, Tien-Chin Lin and Chia-Fang Wu, Journal of the Electrochemical Society, 154 (7) J226-J228 (2007). The emissive layer comprises a 9,10-bis(2'-napthyl)anthracene (ADN) host and a 4,4'-bis[2-(4-(N,N-diphenylamino)phenyl)vinyl]biphenyl (DPAVBi) dopant. At 1,000 cd/m$^2$, a device with this emissive layer operates with 18.0 cd/A luminous efficiency and CIE 1931 (x, y)=(0.155, 0.238). Further example of blue fluorescent dopant are given in "Organic Electronics: Materials, Processing, Devices and Applications", Franky So, CRC Press, p 448-p 449 (2009). One particular example is dopant EK9, with 11 cd/A luminous efficiency and CIE 1931 (x, y)=(0.14, 0.19). Further examples are given in patent applications WO 2009/107596 A1 and US 2008/0203905. A particular example of an efficient fluorescent light blue system given in WO 2009/107596 A1 is dopant DM1-1' with host EM2', which gives 19 cd/A efficiency in a device operating at 1,000 cd/m$^2$.

An example of a light blue phosphorescent device has the structure:

ITO (80 nm)/LG101 (10 nm)/NPD (30 nm)/Compound A: Emitter A (30 nm:15%)/Compound A (5 nm)/Alq$_3$ (40 nm)/LiF(1 nm)/Al (100 nm).

LG101 is available from LG Chem Ltd. of Korea.

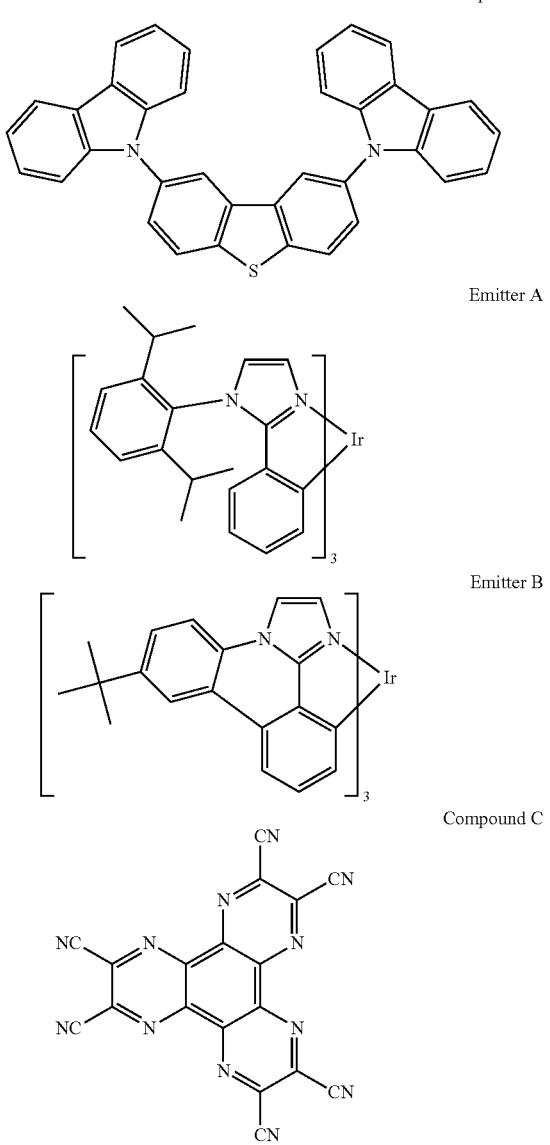

Compound A

Emitter A

Emitter B

Compound C

Such a device has been measured to have a lifetime of 3,000 hrs from initial luminance 1000 nits at constant dc current to 50% of initial luminance, 1931 CIE coordinates of CIE (0.175, 0.375), and a peak emission wavelength of 474 nm in the visible spectrum.

"Deep blue" devices are also readily achievable, but not necessarily having the lifetime and efficiency properties desired for a display suitable for consumer use. One way to achieve a deep blue device is by using a fluorescent emissive material that emits deep blue, but does not have the high efficiency of a phosphorescent device. An example of a deep blue fluorescent device is provided in Masakazu Funahashi et al., Society for Information Display Digest of Technical Papers 47. 3, pp. 709-711 (2008). Funahashi discloses a deep blue fluorescent device having CIE coordinates of (0.140, 0.133) and a peak wavelength of 460 nm. Another way is to use a phosphorescent device having a phosphorescent emissive material that emits light blue, and to adjust the spectrum of light emitted by the device through the use of filters or microcavities. Filters or microcavities can be used to achieve a deep blue device, as described in Baek-Woon Lee, Young In Hwang, Hae-Yeon Lee and Chi Woo Kim and Young-Gu Ju Society for Information Display Digest of Technical Papers 68.4, pp. 1050-1053 (2008), but there may be an associated decrease in device efficiency. Indeed, the same emitter may be used to fabricate a light blue and a deep blue device, due to microcavity differences. Another way is to use available deep blue phosphorescent emissive materials, such as described in United States Patent Publication 2005-0258433, which is incorporated by reference in its entirety and for compounds shown at pages 7-14. However, such devices may have lifetime issues. An example of a suitable deep blue device using a phosphorescent emitter has the structure:

ITO (80 nm)/Compound C(30 nm)/NPD (10 nm)/Compound A: Emitter B (30 nm:9%)/Compound A (5 nm)/Alq3 (30 nm)/LiF(1 nm)/Al (100 nm)

Such a device has been measured to have a lifetime of 600 hrs from initial luminance 1000 nits at constant dc current to 50% of initial luminance, 1931 CIE coordinates of CIE: (0.148, 0.191), and a peak emissive wavelength of 462 nm.

The difference in luminous efficiency and lifetime of deep blue and light blue devices may be significant. For example, the luminous efficiency of a deep blue fluorescent device may be less than 25% or less than 50% of that of a light blue fluorescent device. Similarly, the lifetime of a deep blue fluorescent device may be less than 25% or less than 50% of that of a light blue fluorescent device. A standard way to measure lifetime is $LT_{50}$ at an initial luminance of 1000 nits, i.e., the time required for the light output of a device to fall by 50% when run at a constant current that results in an initial luminance of 1000 nits. The luminous efficiency of a light blue fluorescent device is expected to be lower than the luminous efficiency of a light blue phosphorescent device, however, the operational lifetime of the fluorescent light blue device may be extended in comparison to available phosphorescent light blue devices.

Figure 5:
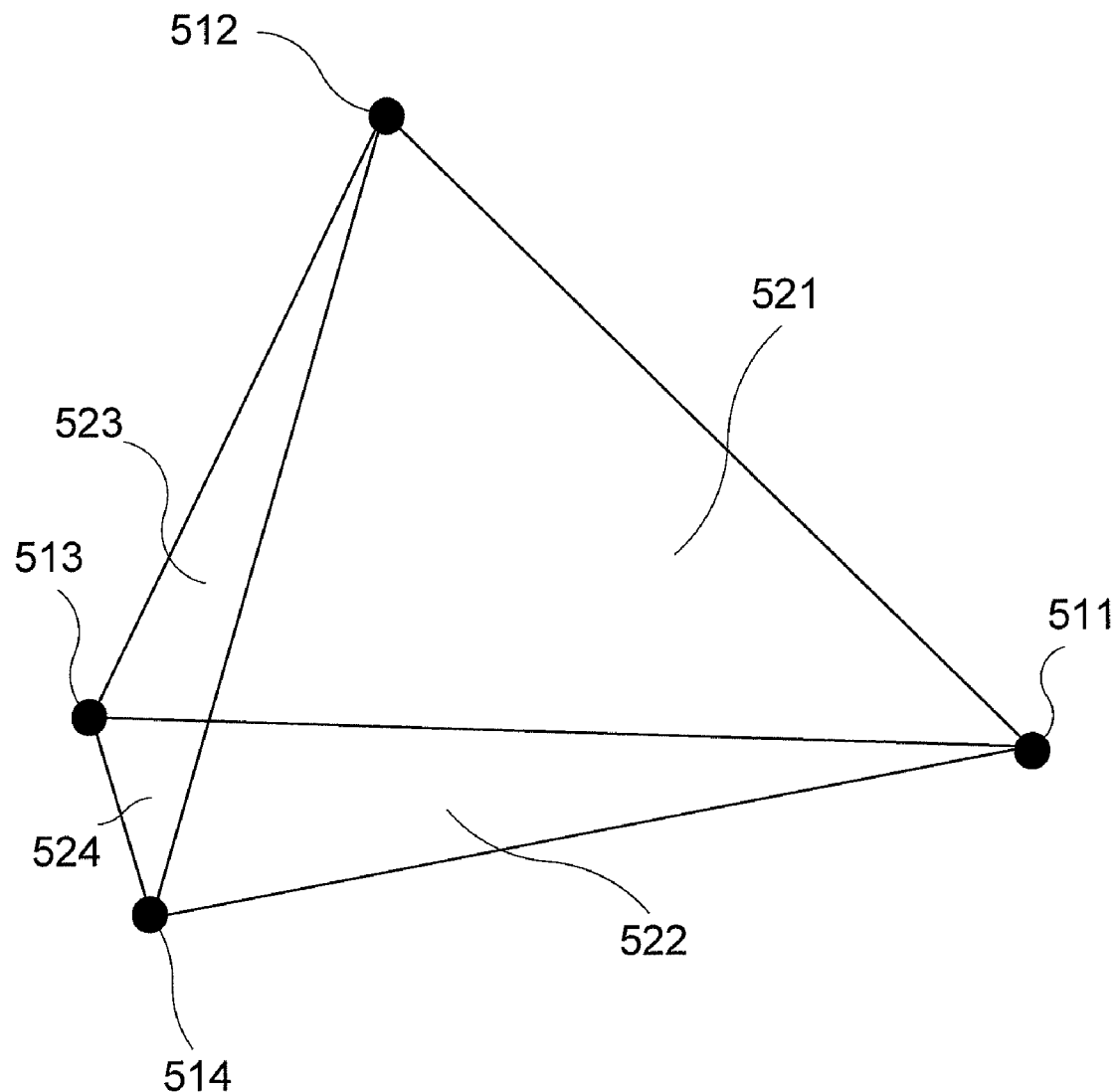
FIG. 5 shows CIE coordinates for various devices.

A device or pixel having four organic light emitting devices, one red, one green, one light blue and one deep blue, may be used to render any color inside the shape defined by the CIE coordinates of the light emitted by the devices on a CIE chromaticity diagram. FIG. 5 illustrates this point. FIG. 5 should be considered with reference to the CIE diagrams of FIGS. 3 and 4, but the actual CIE diagram is not shown in FIG. 5 to make the illustration clearer. In FIG. 5, point 511 represents the CIE coordinates of a red device, point 512 represents the CIE coordinates of a green device, point 513 represents the CIE coordinates of a light blue device, and point 514 represents the CIE coordinates of a deep blue device. The pixel may be used to render any color inside the quadrangle defined by points 511, 512, 513 and 514. If the CIE coordinates of points 511, 512, 513 and 514 correspond to, or at least encircle, the CIE coordinates of devices called for by a standard gamut—such as the corners of the triangles in FIG. 4—the device may be used to render any color in that gamut.

Many of the colors inside the quadrangle defined by points 511, 512, 513 and 514 can be rendered without using the deep blue device. Specifically, any color inside the triangle defined by points 511, 512 and 513 may be rendered without using the deep blue device. The deep blue device would only be needed for colors falling outside of this triangle. Depending upon the color content of the images in question, only minimal use of the deep blue device may be needed.

FIG. 5 shows a "light blue" device having CIE coordinates 513 that are outside the triangle defined by the CIE coordinates 511, 512 and 514 of the red, green and deep blue devices, respectively. Alternatively, the light blue device may have CIE coordinates that fall inside of said triangle.

A preferred way to operate a device having a red, green, light blue and deep blue device, or first, second, third and fourth devices, respectively, as described herein is to render a color using only 3 of the 4 devices at any one time, and to use the deep blue device only when it is needed. Referring to FIG. 5, points 511, 512 and 513 define a first triangle, which includes areas 521 and 523. Points 511, 512 and 514 define a second triangle, which includes areas 521 and 522. Points 512, 513 and 514 define a third triangle, which includes areas 523 and 524. If a desired color has CIE coordinates falling within this first triangle (areas 521 and 523), only the first, second and third devices are used to render the color. If a desired color has CIE coordinates falling within the second triangle, and does not also fall within the first triangle (area 522), only the first, second and fourth devices are used to render color. If a desired color has CIE coordinates falling within the third triangle, and does not fall within the first triangle (area 524), only the first, third and fourth, or only the second, third and fourth devices are used to render color.

Such a device could be operated in other ways as well. For example, all four devices could be used to render color. However, such use may not achieve the purpose of minimizing use of the deep blue device.

Red, green, light blue and blue bottom-emission phosphorescent microcavity devices were fabricated. Luminous efficiency (cd/A) at 1,000 cd/m$^2$ and CIE 1931 (x, y) coordinates are summarized for these devices in Table 1 in Rows 1-4. Data for a fluorescent deep blue device in a microcavity are given in Row 5. This data was taken from Woo-Young So et al., paper 44.3, SID Digest (2010) (accepted for publication), and is a typical example for a fluorescent deep blue device in a microcavity. Values for a fluorescent light blue device in a microcavity are given in Row 9. The luminous efficiency given here (16.0 cd/A) is a reasonable estimate of the luminous efficiency that could be demonstrated if the fluorescent light blue materials presented in patent application WO 2009/107596 were built into a microcavity device. The CIE 1931 (x, y) coordinates of the fluorescent light blue device match the coordinates of the light blue phosphorescent device.

Using device data in Table 1, simulations were performed to compare the power consumption of a 2.5-inch diagonal, 80 dpi, AMOLED display with 50% polarizer efficiency, 9.5V drive voltage, and white point (x, y)=(0.31, 0.31) at 300 cd/m$^2$. In the model, all sub-pixels have the same active device area. Power consumption was modeled based on 10 typical display images. The following pixel layouts were considered: (1) RGB, where red and green are phosphorescent and the blue device is a fluorescent deep blue; (2) RGB1B2, where the red, green and light blue (B1) are phosphorescent and deep blue (B2) device is a fluorescent deep blue; and (3) RGB1B2, where the red and green are phosphorescent and the light blue (B1) and deep blue (B2) are fluorescent. The average power consumed by (1) was 196 mW, while the average power consumed by (2) was 132 mW. This is a power savings of 33% compared to (1). The power consumed by pixel layout (3) was 157 mW. This is a power savings of 20% compared to (1). This power savings is much greater than one would have expected for a device using a fluorescent blue emitter as the B1 emitter. Moreover, since the device lifetime of such a device would be expected to be substantially longer than an RGB device using only a deeper blue fluorescent emitter, a power savings of 20% in combination with a long lifetime is be highly desirable. Examples of fluorescent light blue materials that might be used include a 9,10-bis(2'-napthyl)anthracene (ADN) host with a 4,4'-bis[2-(4-(N,N-diphenylamino)phenyl) vinyl]biphenyl (DPAVBi) dopant, or dopant EK9 as described in "Organic Electronics: Materials, Processing, Devices and Applications", Franky So, CRC Press, p 448-p 449 (2009), or host EM2' with dopant DM1-1' as described in patent application WO 2009/107596 A1. Further examples of fluorescent materials that could be used are described in patent application US 2008/0203905.

Based on the disclosure herein, pixel layout (3) is expected to result in significant and previously unexpected power savings relative to pixel layout (1) where the light blue (B1) device has a luminous efficiency of at least 12 cd/A. It is preferred that light blue (B1) device has a luminous efficiency of at least 15 cd/A to achieve more significant power savings. In either case, pixel layout (3) may also provide superior lifetime relative to pixel layout (1).

TABLE 1

Device data for bottom-emission microcavity red, green, light blue and deep blue test devices. Rows 1-4 are phosphorescent devices. Rows 5-6 are fluorescent devices.

|  |  |  | Luminous Efficiency | CIE 1931 (x, y) |
|---|---|---|---|---|
| Red | R | Phosphorescent | 48.1 | (0.674, 0.324) |
| Green | G | Phosphorescent | 94.8 | (0.195, 0.755) |
| Light Blue | B1 | Phosphorescent | 22.5 | (0.144, 0.148) |
| Deep Blue | B2 | Phosphorescent | 6.3 | (0.144, 0.061) |
| Deep Blue | B2 | Fluorescent | 4.0 | (0.145, 0.055) |
| Light Blue | B1 | Fluorescent | 16.0 | (0.144, 0.148) |

Algorithms have been developed in conjunction with RGBW (red, green, blue, white) devices that may be used to map a RGB color to an RGBW color. Similar algorithms may be used to map an RGB color to RG B1 B2. Such algorithms, and RGBW devices generally, are disclosed in A. Arnold, T. K. Hatwar, M. Hettel, P. Kane, M. Miller, M. Murdoch, J. Spindler, S. V. Slyke, Proc. Asia Display (2004); J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005) ("Spindler"); Du-Zen Peng, Hsiang-Lun, Hsu and Ryuji Nishikawa. Information Display 23, 2, pp 12-18 (2007) ("Peng"); B-W. Lee, Y. I. Hwang, H-Y, Lee and C. H. Kim, SID 2008 International Symposium Technical Digest 39, 2, pp. 1050-1053 (2008). RGBW displays are significantly different from those disclosed herein because they still need a good deep blue device. Moreover, there is teaching that the "fourth" or white device of an RGBW display should have particular "white" CIE coordinates, see Spindler at 37 and Peng at 13.

Figure 6:
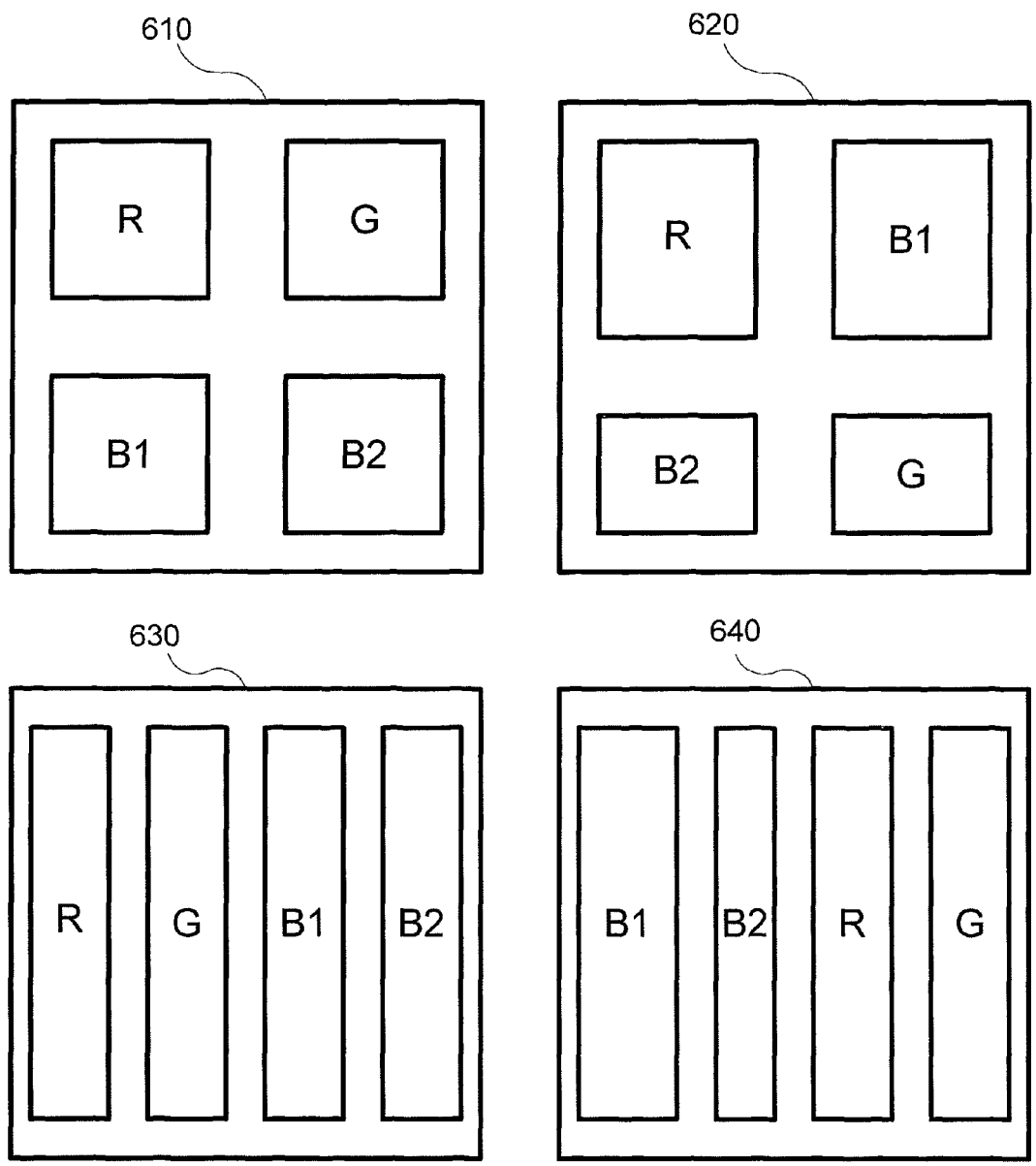
FIG. 6 shows various configurations for a quad pixel architecture having four pixels.

A device having four different organic light emitting devices, each emitting a different color, may have a number of different configurations. FIG. 6 illustrates some of these configurations. In FIG. 6, R is a red-emitting device, G is a green-emitting device, B1 is a light blue emitting device, and B2 is a deep blue emitting device.

Configuration 610 shows a quad configuration, where the four organic light emitting devices making up the overall device or multicolor pixel are arranged in a two by two array. Each of the individual organic light emitting devices in configuration 610 has the same surface area. In a quad pattern, each pixel could use two gate lines and two data lines.

Configuration 620 shows a quad configuration where some of the devices have surface areas different from the others. It may be desirable to use different surface areas for a variety of reasons. For example, a device having a larger area may be run at a lower current than a similar device with a smaller area to emit the same amount of light. The lower current may increase device lifetime. Thus, using a relatively larger device is one way to compensate for devices having a lower expected lifetime.

Configuration 630 shows equally sized devices arranged in a row, and configuration 640 shows devices arranged in a row where some of the devices have different areas. Patterns other than those specifically illustrated may be used.

Other configurations may be used. For example, a stacked OLED with four separately controllable emissive layers, or two stacked OLEDs each with two separately controllable emissive layers, may be used to achieve four sub-pixels that can each emit a different color of light.

Various types of OLEDs may be used to implement various configurations, including transparent OLEDs and flexible OLEDs.

Displays with devices having four sub-pixels, in any of the various configurations illustrated and in other configurations, may be fabricated and patterned using any of a number of conventional techniques. Examples include shadow mask, laser induced thermal imaging (LITI), ink jet printing, organic vapor jet printing (OVJP), or other OLED patterning technology. An extra masking or patterning step may be needed for the emissive layer of the fourth device, which may increase fabrication time. The material cost may also be somewhat higher than for a conventional display. These additional costs would be offset by improved display performance.

A single pixel may incorporate more than the four sub-pixels disclosed herein, possibly with more than four discrete colors. However, due to manufacturing concerns, four sub-pixels per pixel is preferred.

A conventional Red (R), Green (G), Blue (B) OLED display has a large number of pixels, where each pixel has 3 sub-pixels. The three subpixels are three different OLEDs, that emit red, green, and blue respectively. The emissive layer (EML) for each of the 3 sub-pixels (three different OLEDs) are generally each deposited through a fine metal mask, with a separate alignment required for each deposition. Additionally, if the RGB display uses microcavity structures to enhance emission in a particular direction, then the thicknesses of the R, G and B organic stacks are generally separately tuned for each of the three OLEDs according to the individual peak emission wavelength. This is usually achieved by tuning the hole transport layer (HTL) thickness. To do this, a HTL of common thickness is first deposited onto all sub-pixels using a common mask. The deposited common HTL thickness is chosen to match that required to optimize the microcavity for the sub-pixel that needs the thinnest HTL. In practice, this is normally the B sub-pixel, which has the shortest peak emission wavelength. A fine metal mask is then used to deposit additional HTL material for the G subpixel, and then another deposition through a fine metal mask is used to deposit additional material for the R sub pixels. Therefore, for an RGB microcavity display, a total of 5 fine metal mask steps are required: 3 for the RGB EMLs and 2 for the RG HTLs. The same effect can be achieved by tuning electron transport layer (ETL) thickness instead of HTL thickness, in which case the same total number of mask steps is again required.

OLED pixel architectures having four subpixels per pixel ("quad pixel architecture"), have been and are being developed. Examples of these pixels architectures can be found in U.S. Patent Applications: 61/101,757, filed Oct. 1, 2008; Ser. No. 12/565,115, filed Sep. 23, 2009; Ser. No. 12/752,792, filed Apr. 1, 2010; 61/164,667, filed Mar. 30, 2009 and Ser. No. 12/639,541, filed Dec. 16, 2009; and United States Patent Publication US-2010-0090620, published Apr. 15, 2010, which are incorporated by reference in their entireties. An example of such an architecture is an RGB pixel, which has a red emitting OLED, a green emitting OLED, and two different blue emitting OLEDs. Another example is an RGBY architecture, which has red, green, blue and yellow emitting OLEDs. One drawback of a quad pixel architecture is the additional cost of the fine metal mask deposition steps that may be needed to deposit the fourth sub-pixel, such as the extra blue sub-pixel.

It is demonstrated herein that a quad pixel microcavity display, such as an RGB OLED display, may be fabricated using only 1 additional fine metal mask compared to RGB microcavity display. This is achieved by depositing the same HTL thickness for B1 and B2 sub-pixels through a single mask.

An RGB1B2 pixel architecture that can be used to enhance the efficiency and lifetime of OLED displays compared to a standard RGB layout. A stable and high efficiency light blue (B1) sub pixel can be used to render the majority of images, while a less efficient, shorter lived deep blue (B2) sub-pixel is only used when a saturated blue is required. Although, significant power savings can be achieved using RGB1B2, there are potentially additional manufacturing costs because of the extra blue sub-pixel. Specifically, an extra fine metal mask step (compared to RGB) is needed to deposit the additional B1 EML layer. Additionally, in the case of an RGB1B2 microcavity display, an extra fine metal mask step would be expected to deposit the HTL layer for the B1 sub-pixel. It would therefore be expected that an RGB microcavity display would require 2 additional fine metal mask steps compared to a standard RGB microcavity display.

A novel method is provided for reducing the number of fine metal mask steps needed to manufacture an RGB1B2 microcavity display. This is achieved by using the same thickness of HTL for both B1 and B2 sub-pixels, so that B1 and B2 HTLs can be deposited in a single step through a single mask. One general concept driving the design of a microcavity display is that the thickness of each different type of OLED in the display is separately optimized to create a microcavity that enhances the emission of the specific spectrum of light emitted by the OLED. However, it is demonstrated herein that a minimal loss in panel efficiency is experienced using a common device thickness for the B1 and B2 OLEDs in an RGB1B2 quad pixel. This unexpected result arises because the peak emission wavelengths of B1 and B2 are much more closely matched than for R, G and B, so approximately the same microcavity can be used for both B1 and B2. In addition, the usage time of the B2 device in a typical application is minimal due to the small CIE area for which a contribution from the B2 device is needed, therefore the contribution to the power budget is also minimal. Hence using a common B1/B2 HTL a sacrifice can be made in optimizing the efficiency of the B2 (deep blue device) in order to optimize the B1 device, while not separately tuning the B2 device. This reduces the number of fine metal mask steps needed to manufacture an RGB1B2 microcavity display from 7 to 6, thereby reducing manufacturing costs. Device thickness is most commonly controlled by adjusting HTL thickness, but microcavities may also be tuned by altering the thickness of other layers, such as the ETL thickness. In this case, B1 and B2 ETL layers would be deposited to the same thickness through a single mask.

"Tuning" a device may be done for a number of reasons, and generally involves a separate deposition through a fine metal mask to specifically control the materials and/or thicknesses of layers in a particular device. While many of the embodiments described herein are describe in the context of tuning a microcavity, one of skill in the art understands that the concept of "tuning" is more general and applies in other contexts as well. Embodiments of the invention are applicable in these other contexts. For example, tuning may be used to control thickness to adjust where recombination occurs, to incorporate specific materials that are a good match for the emitter in a device, and for other reasons.

When depositing an OLED, a significant part of the cost and effort is due to deposition steps that require a fine metal mask. Fine metal masks are used to cover OLEDs or substrate regions onto which deposition is not desired, while allowing deposition onto other OLEDs. As a result, openings in the mask must be precisely aligned over the proper OLEDs. Each such alignment adds significant cost to the fabrication process. Thus, the deposition of a layer onto one or more OLEDs in a pixel, but not all OLEDs in the pixel, adds significant cost to the fabrication process. As a result, any reduction in the number of fine metal mask steps needed to deposit a pixel may lead to a significant reduction in fabrication cost. Fine metal masks also need to be regularly cleaned in order for the open areas to remain a fixed size. This also adds to the cost of the fine metal masking process steps.

By way of contrast, deposition of a layer common to all OLEDs in a pixel does not add as much cost. This is because, even if a mask is used to roughly limit deposition to the area of a display, it does not need to be aligned to the same precision as a fine metal mask.

A device is provided. The device includes a quad pixel, which means the device has at least four separate pixels. Each pixel is an organic light emitting device (OLED), such that there is a first, second, third and fourth OLED. Each of the first, second, third and fourth OLEDs independently has a first electrode and a second electrode. Each OLED also independently has an organic emissive stack having an emitting material, disposed between the first and second electrodes; a first organic stack disposed between and in contact with the first electrode and the emissive stack; and a second organic stack disposed between and in contact with the second electrode and the emissive layer. The organic emissive stack of the first OLED, the organic emissive stack of the second OLED, the organic emissive stack of the third OLED, and the organic emissive stack of the fourth OLED each have different emissive spectra. The first organic stack of the first OLED, the first organic stack of the second OLED, and the first organic stack of the third OLED are different from each other in materials or thickness, or both. The first organic stack of the third OLED and the first organic stack of the fourth OLED are the same.

As used herein, the "emissive spectra" of an "organic emissive stack" is considered to be a property of the organic emissive stack isolated from any microcavity effects that may occur in a device. For example, two organic emissive stacks, each having a single (and different) emitting material would be considered to have different emissive spectra. Also, three organic emissive stacks with some overlap in the emitting materials, but different mixtures, may be considered to have different emissive spectra. For example, an organic emissive stack where only a green emitting material emits, an organic emissive stack where only a red emitting material, and an organic emissive stack having a mixture of the green and red emitting materials where both materials emit, resulting in a combined spectrum that is yellow, would all be considered as having "different emissive spectra." However, two organic emissive stacks having exactly the same single emitting material would be considered as having the same emissive spectra, even if they were present in different OLEDs with different microcavity effects that result in the OLEDs themselves having different emissive spectra. By "non-emitting," it is meant that a material does not emit an amount of light that is significant from a device performance viewpoint, i.e., slight emission from impurities or slight and unintended negligible emission does not make a material "emitting."

As used herein, when multiple OLEDs are described as "independently" having a particular layer, that layer may be the same or different in the different OLEDs. The layer may be physically separated from the corresponding layer in other OLEDs, such as in the case of patterned anodes, or may be physically connected to the corresponding layers in other OLEDs, such as in the case of a common cathode.

As used herein, the term "organic emissive stack" refers to any organic layer in a device that emits more than a negligible quantity of light as considered from the perspective of practical device performance. The "organic emissive stack" may also include any layer adjacent to an emissive layer that is made entirely of a subset of the materials of the emitting layer. For example, an emissive layer may include a host and a dopant, and a blocking layer adjacent to the emissive layer might include only the host but not the dopant. Both the emissive layer and the blocking layer would be considered a part of the "organic emissive stack." This is for the practical reason that such a blocking layer is often deposited immediately after (or before) the emitting layer through the same mask by simply turning off (or on) the flow of dopant molecule during the deposition process, and can be deposited for essentially no additional cost ancillary to deposition of the emitting layer itself.

Figure 7:
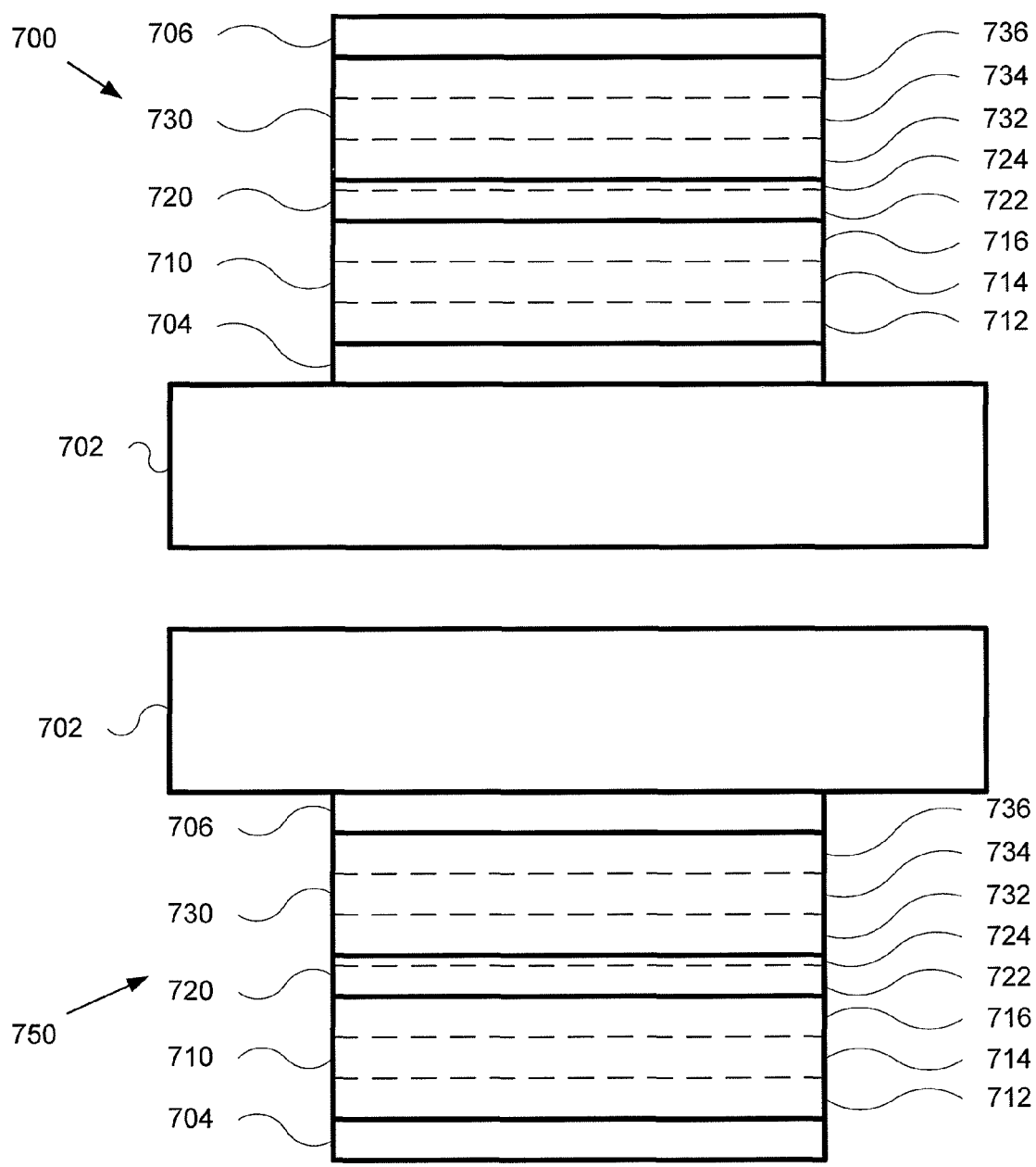
FIG. 7 shows FIG. 7 two separate architectures of a single OLED.

As used herein, the terms "first electrode" and "second electrode refer to the two electrodes of an OLED. The terms "first" and "second" are completely arbitrary—the first electrode may be the anode and the second electrode may be the cathode, or vice versa. The first electrode or the second electrode may be disposed closest to a substrate on which the device is fabricated. These concepts are illustrated in FIG. 7.

As used herein, the term "first organic stack" refers to any organic layers that may be present between the organic emissive stack and the first electrode of a device. The first organic stack may include any of a variety of layers that are useful in OLEDs, such as injection layers, transport layers, blocking layers, etc. Some examples of such layers are illustrated in FIGS. 1 and 2. The types of layers present in the first organic stack will depend, among other factors, on whether the first electrode is an anode or a cathode.

As used herein, the term "second organic stack" refers to any organic layers that may be present between the organic emissive stack and the second electrode of a device. The second organic stack may include any of a variety of layers that are useful in OLEDs, such as injection layers, transport layers, blocking layers, etc. Some examples of such layers are illustrated in FIGS. 1 and 2. The types of layers present in the second organic stack will depend, among other factors, on whether the second electrode is an anode or a cathode.

In one embodiment, the first electrode is an anode and the OLED is a bottom emitting OLED for each of the first OLED, the second OLED, the third OLED and the fourth OLED.

In one embodiment, the first electrode is an anode and the OLED is a top emitting OLED for each of the first OLED, the second OLED, the third OLED and the fourth OLED.

In one embodiment, the first electrode is a cathode and the OLED is a bottom emitting OLED for each of the first OLED, the second OLED, the third OLED and the fourth OLED.

In one embodiment, the first electrode is a cathode and the OLED is a top emitting OLED for each of the first OLED, the second OLED, the third OLED and the fourth OLED.

In order to minimize the number of fine alignment steps needed to fabricate a microcavity OLED, it is preferred that one of the first and second organic stacks is exactly the same across all OLEDs, and that any adjustments to device thickness for the purpose of optimizing microcavity dimensions, and/or differences in transport, injection or blocking materials, which requires depositions through finely aligned masks, are made in only one of the first and second organic stacks. In other embodiments, though, optimizations may be made in both the first and second organic stacks.

In one embodiment, the second organic stack is the same in each of the first OLED, the second OLED, the third OLED and the fourth OLED.

In one embodiment, the second organic stack is different in each of the first OLED, the second OLED, the third OLED and the fourth OLED.

The purpose of the quad pixel architecture as described herein is to provide a pixel that emits four separately controllable spectra of light. Moreover, for embodiments involving architectures where the first organic stack of the third OLED and the first organic stack of the fourth OLED are the same, it is intended that the differences in the emission of the OLEDs are due to differences in the emitting materials of the OLEDs, as opposed to microcavity effects alone.

In one embodiment, a quad pixel is provided where the four colors of light are roughly red, green, a first blue, and a second blue different from the first blue. Each of the first, second, third and fourth OLEDs has a single emissive material, different from the emissive material of each of the other OLEDs. The emitting material of the first OLED emits light having a peak wavelength in the visible spectrum of 600-700 nm, and is a phosphorescent material. The emitting material of the second OLED emits light having a peak wavelength in the visible spectrum of 500-600 nm, and is a phosphorescent material. The emitting material of the third OLED emits light having a peak wavelength in the visible spectrum of 400-500 nm. The emitting material of the fourth OLED emits light having a peak wavelength in the visible spectrum of 400-500 nm. The peak wavelength in the visible spectrum of light emitted by the fourth organic light emitting device is at least 4 nm less than the peak wavelength in the visible spectrum of light emitted by the third organic light emitting device. The emitting materials of the third OLED and the fourth OLED may be any combination of phosphorescent and fluorescent materials. Both may be phosphorescent materials, both may both be fluorescent materials, or one may be fluorescent and other may be phosphorescent. For example, the emitting material of the third OLED may be a phosphorescent material and the emitting material of the fourth OLED may be a fluorescent material.

In one embodiment, a quad pixel is provided where the four colors of light are roughly red, green, blue, and yellow. In one embodiment, each of the first, second, third and fourth OLEDs has an organic emissive stack that emits a spectrum of light different from the spectrum emitted by the organic emissive stack of each of the other OLEDs. The organic emissive stack of the first OLED emits light having a peak wavelength in the visible spectrum of 600-700 nm, and includes a phosphorescent emitting material. The organic emissive stack of the second OLED emits light having a peak wavelength in the visible spectrum of 500-600 nm, and includes a phosphorescent emitting material. The organic emissive stack of the third OLED emits light having a peak wavelength in the visible spectrum of 400-500 nm. The organic emissive stack of the fourth OLED emits light having a peak wavelength in the visible spectrum of 550-600 nm, and includes a phosphorescent emitting material. The peak wavelength in the visible spectrum of light emitted by the fourth organic light emitting device is at least 10 nm greater than the peak wavelength in the visible spectrum of light emitted by the second organic light emitting device, and at least 10 nm less than the peak wavelength in the visible spectrum of light emitted by the first organic light emitting device. The fourth OLED may include multiple emitting materials.

The emitting material of one OLED may be present as a non-emitting material in other OLEDs. Usually, this emitting material will be one of the higher energy (lower wavelength) emitting materials in the quad pixel, which can readily be made non-emitting in some of the OLEDs by providing a lower energy emitting site. In one embodiment, the organic emissive stack of the fourth OLED includes an organic emissive layer of the fourth OLED, and the organic emissive layer of the fourth OLED is the same as, and is deposited at the same time as, a component of either the first or second organic stacks of the first, second and third OLEDs, which are by their nature non-emitting because they are in the first or second organic stacks. In this embodiment, it is possible to fabricate a quad pixel architecture with four different OLEDs, each having a different emitter, using only 5 depositions through an aligned metal mask.

In one embodiment, the device is a consumer device that includes a plurality of quad pixels.

A method of depositing a device comprising a quad pixel is provided. The quad pixel includes a first OLED, a second OLED, a third OLED and a fourth OLED. Each OLED independently has an area of a substrate over which the OLED is disposed; a first electrode; a second electrode; an organic emissive stack having an emitting material, disposed between the first and second electrodes; a first organic stack disposed between and in contact with the first electrode and the emissive layer; and a second organic stack disposed between and in contact with the second electrode and the organic emissive stack. The organic emissive stack of the first OLED, the organic emissive stack of the second OLED, the organic emissive stack of the third OLED, and the organic emissive stack of the fourth OLED each have different emissive spectra. The first organic stack of the first OLED, the first organic stack of the second OLED, and the first organic stack of the third OLED are different from each other in materials or thickness or both. The method comprises depositing each component of the first organic stack of the third OLED at the same time as the same component in the first organic stack of the fourth OLED.

For quad pixel architectures where the thickness of the first organic stack is used to tune microcavity dimensions, it is unexpected that each component of the first organic stack of the third OLED may be deposited at the same time as the same component in the first organic stack of the fourth OLED. This method leads to third and fourth OLEDs having first organic stacks that are exactly the same, including in thickness. The advantage of the method is that it allows for the elimination of an extra deposition through a fine mask, significantly reducing manufacturing costs. The downside of the method is that the microcavities of the third and fourth OLEDs may not be separately tuned using the first organic stack. However, it is shown that this loss of flexibility in microcavity tuning may not be as detrimental in a quad pixel architecture as it is in the RGB pixel architecture that dominates the industry. This is because, in a quad pixel architecture, the peak emissive wavelength of at least some of the different OLEDs are closer to one another than they are in an RGB architecture. This is more or less present in all quad pixel architectures, because four different spectra are crowded closer together in CIE space than three different spectra. The phenomena may be more pronounced in some quad pixel architectures, such as an RGB1B2 architecture, where two of the devices have different, yet very similar emissive spectra.

In one embodiment, during the deposition of the first organic stacks of the first, second, third and fourth OLEDs, there are at most two alignments of masks that allow deposition over some but not all of the areas of the first, second, third and fourth OLEDs, and the deposition of one or more components of the first organic stack of some but not all of the first, second, third and fourth OLEDs through each of the masks. There may be exactly two such alignments. Each alignment allows the thickness and/or material of one OLED to be tuned independently of the other OLEDs. For example, these two alignments allow the thickness and/or materials of a component of the first organic stacks of the first and second OLEDs to be tuned independently of each other, and independently of the third and fourth OLEDs. However, there are not enough alignments for the thickness and/or materials of the first organic stack of the third and fourth OLEDs to also be tuned.

Optionally, during the deposition of the first organic stacks of the first, second, third and fourth OLEDs, and prior to the deposition through two masks that allow deposition over some but not all of the first, second, third and fourth OLEDs, there is a deposition of one or more components of the first organic stacks of the first, second, third and fourth OLEDs. Optionally, during the deposition of the first organic stacks of the first, second, third and fourth OLEDs, and after the deposition through the two masks that allow deposition over some but not all of the first, second, third and fourth OLEDs, there is a deposition of one or more components of the first organic stacks of the first, second, third and fourth OLEDs. These depositions do not allow for separate tunings of the materials and/or thicknesses of different OLEDs, but do allow for the deposition of components that are useful, or at least not significantly detrimental, in all OLEDs of the quad pixel.

In one embodiment, during the deposition of the quad pixel, there are at most six alignments of masks that allow deposition over some but not all of the areas of the first, second, third and fourth OLEDs, and the deposition of one or more components of the first, second, third and fourth OLEDs through each of the masks. For example, these six alignments may be four alignments to allow for different emissive stacks in each of the four OLEDs, and two alignments that allow for the separate tuning of a component of the first organic stack of the first and second OLEDs.

In one embodiment, one or more components of the first organic stack of each of the first, second, third and fourth OLEDs are deposited over the area of each of the first, second, third and fourth OLEDs. In addition, a mask is aligned that allows for deposition over the area of the second OLED and not the areas of the first, third and fourth OLEDs, and deposition is performed through the mask over the area of the second OLED and not over the area of the first, third and fourth OLEDs, of one or more components of the first organic stack of the second OLED. Also, a mask is aligned that allows for deposition over the area of the third and fourth OLEDs and not the areas of the first and second OLEDs, and deposition is performed through the mask over the area of the third and fourth OLEDs and not over the area of the first and second OLEDs, of one or more components of the first organic stack of the third and fourth OLEDs. These depositions, and the corresponding alignments, may be performed in the order described, or in a different order. This embodiment is one way that two alignments may be used to separately tune the materials and/or thicknesses of a component of the first organic stack of the first and second OLEDs, while tuning the materials and/or thicknesses of the first organic stack of the third and fourth OLEDs in the same way, and is illustrated with respect to FIG. 10, configuration 1020.

In one embodiment, one or more components of the first organic stack of each of the first, second, third and fourth OLEDs are deposited over the area of each of the first, second, third and fourth OLEDs. In addition, a mask is aligned that allows for deposition over the area of the second, third and fourth OLEDs and not the areas of the first OLED, and deposition is performed through the mask over the area of the second, third and fourth OLEDs and not over the area of the first OLED, of one or more components of the first organic stack of the second, third and fourth OLEDs. Also, a mask is aligned that allows for deposition over the area of the third and fourth OLEDs and not the areas of the first and second OLEDs, and deposition is performed through the mask over the area of the third and fourth OLEDs and not over the area of the first and second OLEDs, of one or more components of the first organic stack of the third and fourth OLEDs. These depositions, and the corresponding alignments, may be performed in the order described, or in a different order. This embodiment is another way that two alignments may be used to separately tune the materials and/or thicknesses of a component of the first organic stack of the first and second OLEDs, while tuning the materials and/or thicknesses of the first organic stack of the third and fourth OLEDs in the same way, and is illustrated with respect to FIG. 10, configuration 1010.

In one embodiment, one or more components of the first organic stack of each of the first, second, third and fourth OLEDs are deposited over the area of each of the first, second, third and fourth OLEDs. Also, a mask is aligned that allows for deposition over the area of the first and second OLEDs and not the areas of the third and fourth OLEDs, and deposition is performed through the mask over the area of the first and second OLEDs and not over the area of the third and fourth OLEDs, of one or more components of the first organic stack of the first and second OLEDs. In addition, a mask is aligned that allows for deposition over the area of the first OLED and not the areas of the second, third and fourth OLEDs, and deposition is performed through the mask over the area of the first OLED and not over the area of the second, third and fourth OLEDs, of one or more components of the first organic stack of the first OLED. These depositions, and the corresponding alignments, may be performed in the order described, or in a different order. This embodiment is one way that two alignments may be used to separately tune the materials and/or thicknesses of a component of the first organic stack of the first and second OLEDs, while tuning the materials and/or thicknesses of the first organic stack of the third and fourth OLEDs in the same way, and is illustrated with respect to FIG. 11, configuration 1110.

In one embodiment, one or more components of the first organic stack of each of the first, second, third and fourth OLEDs are deposited over the area of each of the first, second, third and fourth OLEDs. A mask is aligned that allows for deposition over the area of the first OLED and not the areas of the second, third and fourth OLEDs, and deposition is performed through the mask over the area of the first OLED and not over the area of the second, third and fourth OLEDs, of one or more components of the first organic stack of the first OLED. A mask is aligned that allows for deposition over the area of the second OLED and not the areas of the first, third and fourth OLEDs, and deposition is performed through the mask over the area of the second OLED and not over the area of the first, third and fourth OLEDs, of one or more components of the first organic stack of the first OLED. These depositions, and the corresponding alignments, may be performed in the order described, or in a different order. This embodiment is one way that two alignments may be used to separately tune the materials and/or thicknesses of a component of the first organic stack of the first and second OLEDs, while tuning the materials and/or thicknesses of the first organic stack of the third and fourth OLEDs in the same way, and is illustrated with respect to FIG. 11, configuration 1120.

In one embodiment of a method, for each of the first OLED, the second OLED, the third OLED and the fourth OLED: the first electrode is an anode; the second electrode is a cathode, and the OLED is a bottom emitting OLED. In addition to method steps described above, the method further includes: providing over the substrate the first electrode of each of the first, second, third and fourth OLEDs. For each of the first, second, third and fourth OLEDs, the following are deposited, in order, over the first electrode and over the previous stack: a first organic stack; an organic emissive stack, and a second organic stack, and a second electrode.

In one embodiment, for example further to the method described in the previous paragraph, depositing the first organic stack includes, for each of the first, second, third and fourth OLEDs, depositing in order: a hole injection layer and a hole transport layer. The hole injection layer for each of the first, second, third and fourth OLEDs are deposited at the same time. Multiple steps and different masks are used to deposit hole transport layers that are different for the first, second and third OLEDs. The hole transport layers of the third and fourth OLEDs are deposited at the same time. In other embodiments, other layers may optionally be included, such as blocking layer for each of the first, second, third and fourth OLEDs that are deposited at the same time.

In one embodiment, for example further to the method described in the previous paragraph, the emissive stack of each of the first, second, third and fourth OLEDs is deposited through a different mask and has a material composition different from each of the other emissive stacks.

Various embodiments are directed to specific configurations and ways to deposit the first organic stacks of first, second, third and fourth OLEDs in a way that uses less fine mask steps than might be expected for a quad pixel architecture with microcavities having controlled thickness. Any of a variety of configurations and methods may be used for the corresponding emissive and second organic stacks. Preferably, and in keeping with the desire to minimize the number of fine mask alignments, no depositions through fine masks are used during deposition of the second organic stacks, i.e., preferably the second organic stacks of the first, second, third and fourth OLEDs are all the same. In addition, and also in keeping with the desire to minimize the number of fine mask steps, only one deposition through a fine mask is used per organic emissive layer.

In one embodiment, the emissive stack of at least one of the first, second, third and fourth OLEDs includes an emissive layer having a host and a dopant, and a blocking layer having the host and not the dopant. Note that such a blocking layer does not involve the use of an additional mask alignment, because it is deposited immediately before or after the emissive layer and through the same mask. Such a blocking layer may, in addition to blocking, be used to adjust the microcavity thickness of an individual OLED without the use of an additional mask alignment step. However, in some embodiments, it may not be desirable to use such a blocking layer in this way depending on how much a thicker blocking layer adds to the drive voltage of a device.

In one embodiment, depositing the second organic stack includes, for each of the first, second, third and fourth OLEDs, depositing in order: an electron transport layer; and an electron injection layer. The electron injection layer for each of the first, second, third and fourth OLEDs are deposited at the same time. The electron transport layer for each of the first, second, third and fourth OLEDs are deposited at the same time. This embodiment is preferable used in combination with an emissive stack that includes a blocking layer.

In one embodiment, each layer of the second organic stack of each of the first, second, third and fourth OLEDs is deposited at the same time through the same mask.

In one embodiment, deposition of the second organic stack includes depositing an electron transport layer.

However, it may in some circumstances be useful to use one or more depositions through a fine mask during deposition of the second organic stacks. In one embodiment, depositing the second organic stack includes, for each of the first, second, third and fourth OLEDs, depositing in order: a blocking layer; an electron transport layer; and an electron injection layer. The blocking layer for each of the first, second, third and fourth OLEDs are deposited at the same time, and the electron injection layer for each of the first, second, third and fourth OLEDs are deposited at the same time. Multiple steps and different masks are used to deposit electron transport layers that are different for the first, second and third OLEDs. The electron transport layers of the third and fourth OLEDs are deposited at the same time. In another embodiment, electron transport layer thickness may be tuned, and different blocking layers may be used. Other embodiments may also be practiced.

FIG. 7 shows two separate architectures of a single OLED that are useful for understanding embodiments of the invention, particularly with respect to the way organic layers, organic stacks and electrodes are named.

OLED 700 is fabricated on a substrate 702, and includes a first electrode 704, a first organic stack 710, an organic emissive stack 720, a second organic stack 730, and a second electrode 706. First organic stack may further include multiple components 712, 714 and 716. Organic emissive stack 720 may further include multiple components 722 and 724. Second organic stack 730 may further include multiple components 732, 734 and 736. The labels "first" and "second" are arbitrary—the first electrode may be an anode and the second electrode may be a cathode, or vice versa (i.e., the second electrode may be a cathode and the first electrode may be an anode). Similarly, the first organic stack may be the layer or layers of an OLED through which holes pass on their way from an anode towards an emissive layer, and the second organic stack may be the layer or layers of an OLED through which electrons pass on their way from an cathode towards an emissive layer, or vice versa. While illustrated as having multiple component layers, each of the first organic stack 710, organic emissive stack 720 and second organic stack 730 may have multiple component layers as shown, a different number of component layers than shown, or only a single layer. In some embodiments, second organic stack 730 may be absent from the device.

OLED 750 includes the same layers as OLED 700, but substrate 702 is in a different position. OLED 750 illustrates that the first organic stack may be further from the substrate than the organic emissive stack (OLED 750), or closer to the substrate than the organic emissive stack.

To summarize, FIG. 7 shows that a "first organic stack" may be between an anode and an emissive stack or between a cathode and an emissive stack. In addition, independently of where the first organic stack is located relative to an anode, organic emissive stack, and cathode, the first organic stack may be located closer to or farther from the substrate than the organic emissive stack.

In a preferred embodiment, OLED 700 is a bottom emitting OLED (the OLED emits through the substrate) with the anode closer to the substrate than the cathode, and where the first organic stack includes a hole transport layer, i.e., the first organic stack is disposed between the organic emissive stack and the anode. First organic stack 710 may include component layers 712, 714 and 716 that are a hole injection layer, a hole transport layer, and a blocking layer, respectively. Component layer 716 is preferably omitted. Other configurations may be used. Organic emissive stack 720 preferably includes component layers 722 and 724 that are an emissive layer and a blocking layer, respectively, where the emissive layer has a host and a dopant, and the blocking layer is made of the host. Other configurations may be used. Second organic stack 730 preferably includes component layers 734 and 736 that are an electron transport layer and an electron injection layer. Component layer 732 is optionally omitted, or may be a blocking layer. However, many other configurations are possible.

Figure 8:
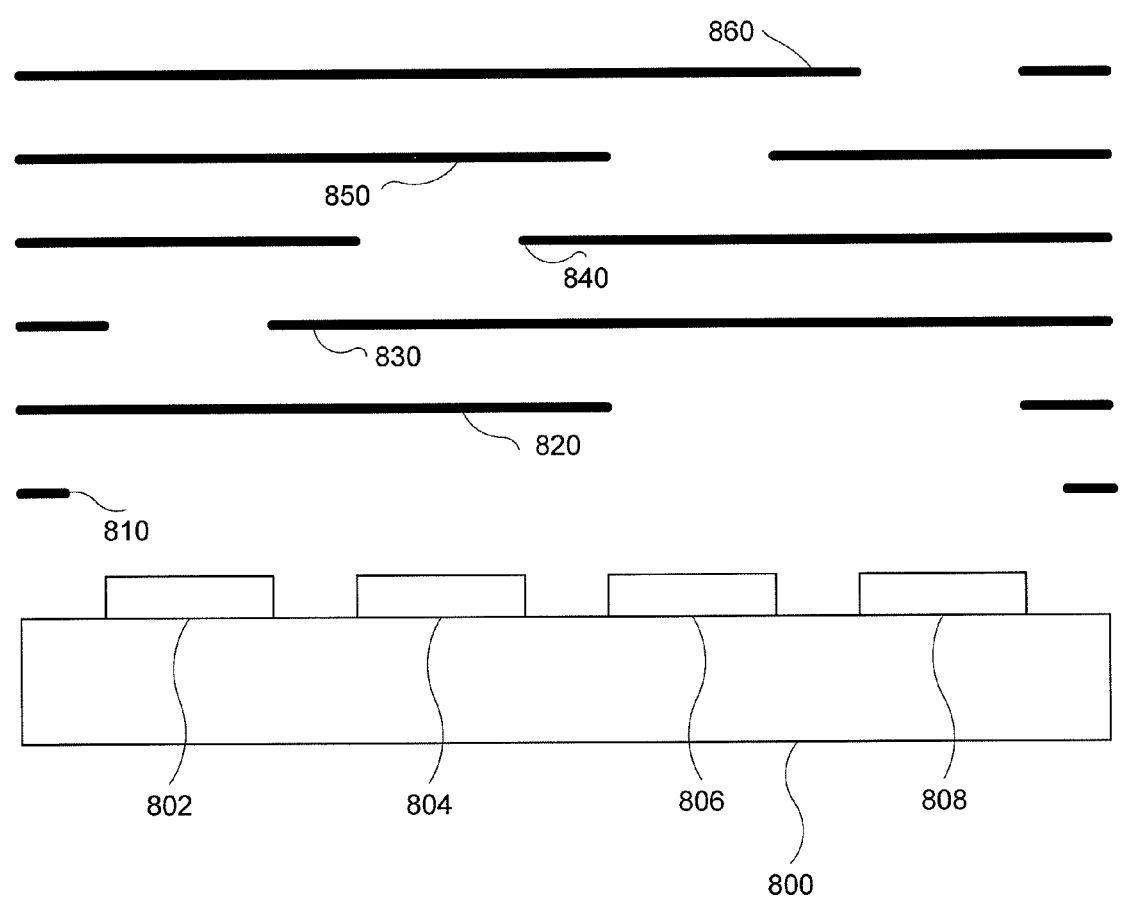
FIG. 8 shows a variety of masks that may be used during the fabrication of a quad pixel architecture.

FIG. 8 shows a variety of masks that may be used during the fabrication of a quad pixel architecture. A substrate 800 has first, second, third and fourth areas 802, 804, 806 and 808 onto which first, second, third and fourth OLEDs, respectively, may be fabricated. Mask 810 allows for deposition onto all OLEDs in the quad pixel. For larger depositions, such as a display, it is likely that mask 810 allows for deposition onto an area significantly larger than a single quad pixel, such as the entire display area. As a result, mask 810 generally does not require a fine alignment step with a precision sufficient to align a mask opening to a specific pixel. Mask 810 may be roughly aligned, but this type of rough alignment is more or less free in terms of fabrication cost. Mask 820 allows for deposition onto third and fourth areas 806 and 808, but not first and second areas 802 and 804. Mask 830 allows for deposition onto first area 802 but not second, third and fourth areas 804, 806 and 808. Mask 840 allows for deposition onto second area 804 but not first, third and fourth areas 802, 806 and 808. Mask 850 allows for deposition onto third area 806 but not first, second and fourth areas 802, 804 and 808. Mask 860 allows for deposition onto fourth area 808 but not first, second and third areas 802, 804 and 806. Other masks may also be used that allow for deposition onto one or more, but not all, of areas 802, 804, 806 and 808. Masks that allow for deposition onto some but not all of areas 802, 804, 806 and 808 are generally aligned with a "fine alignment" having a precision sufficient to ensure that deposition occurs over the desired area. Each such fine alignment may add significantly to the cost of fabrication.

Figure 9:
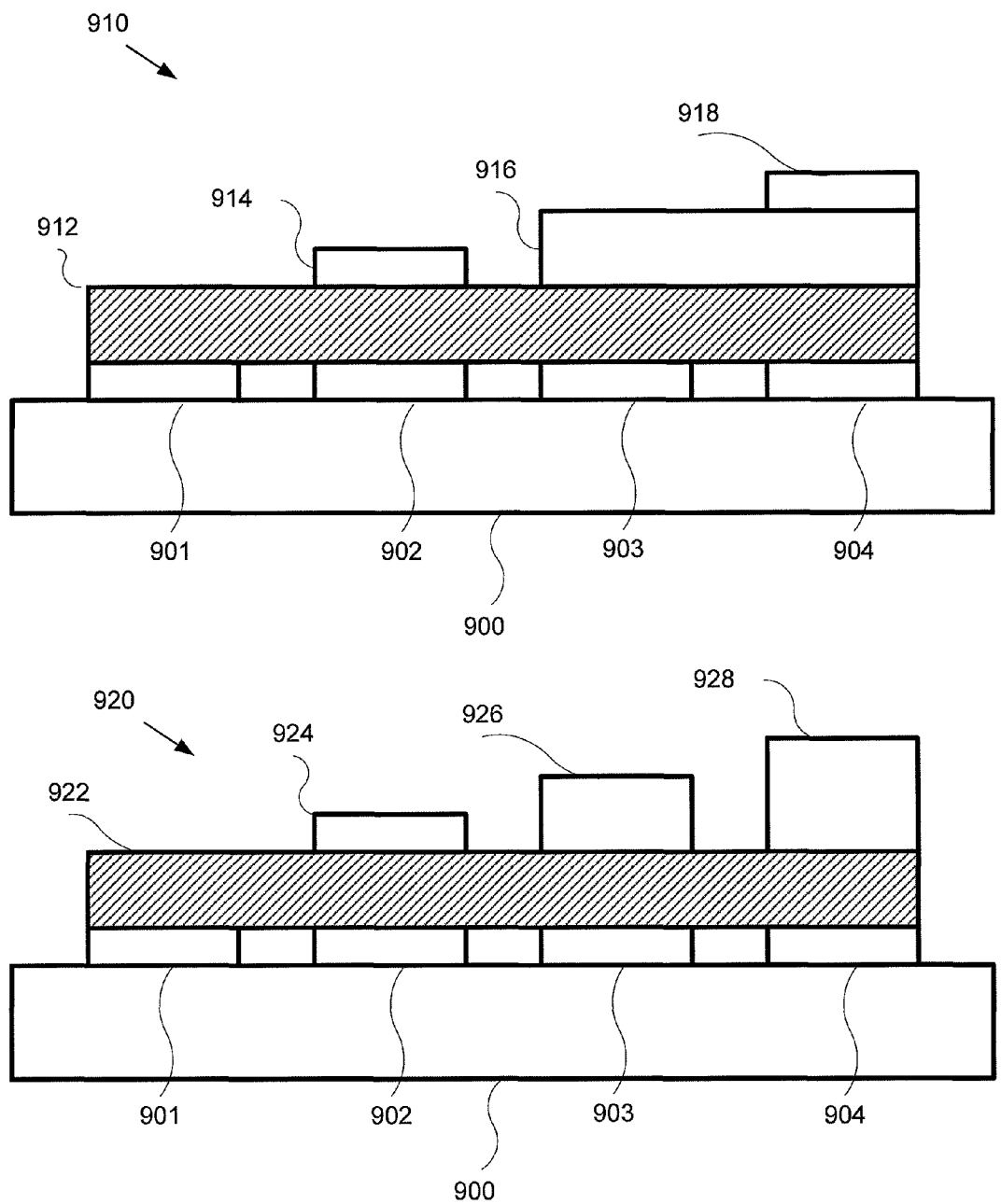
FIG. 9 shows portions of quad pixel architectures.

FIG. 9 shows portions of quad pixel architectures. FIG. 9 specifically shows a part of the first organic stack for each of four subpixels that may be different for each OLED. Preferably, all other parts of the first organic stack are the same for every OLED, and do not require any fine alignments to deposit. A substrate 900 has first, second, third and fourth areas 901, 902, 903 and 904 over which first, second, third and fourth OLEDs, respectively, may be fabricated. FIG. 9 does not show parts of the OLEDs other than a part of the first organic stacks, such as first and second electrodes, an emissive stack, a second organic stack, or the remainder of the first organic stack. The parts of first organic stacks as illustrated in FIG. 9 may be incorporated into a variety of OLED configurations, such as those shown in FIG. 7.

Configuration 910 shows an architecture where a part of the first organic stack for each of four subpixels may be different for each OLED. Configuration 910 may be achieved using one deposition without a fine alignment to deposit layer 912, and three depositions with a fine alignment to deposit layers 914, 916 and 918. Layers 912, 914, 916 and 918 may be the same material or blend of materials, or may include different materials or blends of materials. Preferably, layers 912, 914, 916 and 918 are the same material, and the fine alignment deposition steps are used to tune thickness to achieve a desired and separately tunable microcavity for each of the four OLEDs.

Configuration 920 shows an architecture where a part of the first organic stack for each of four subpixels may be different for each OLED. Configuration 920 may be achieved using one deposition without a fine alignment to deposit layer 922, and three depositions with a fine alignment to deposit layers 924, 926 and 928. Layers 922, 924, 926 and 928 may be the same material or blend of materials, or may include different materials or blends of materials. Preferably, layers 922, 924, 926 and 928 are the same material, and the fine alignment deposition steps are used to tune thickness to achieve a desired and separately tunable microcavity for each of the four OLEDs.

Preferably, layers 912, 914, 916 and 918 together form the transport layers (HTL or ETL) of the first organic stack of each of the first, second, third and fourth OLEDs. Thus, the thickness of the transport layer of a particular OLED may be tuned depending upon which of layers 912, 914, 916 and 918 are present in the particular OLED. Any other layers of the first organic stack of the OLEDs are preferably the same across all OLEDs in the quad pixel, such that fine alignments are not needed to deposit the layers. Similar considerations apply to the corresponding layers of configuration 920.

Figure 10:
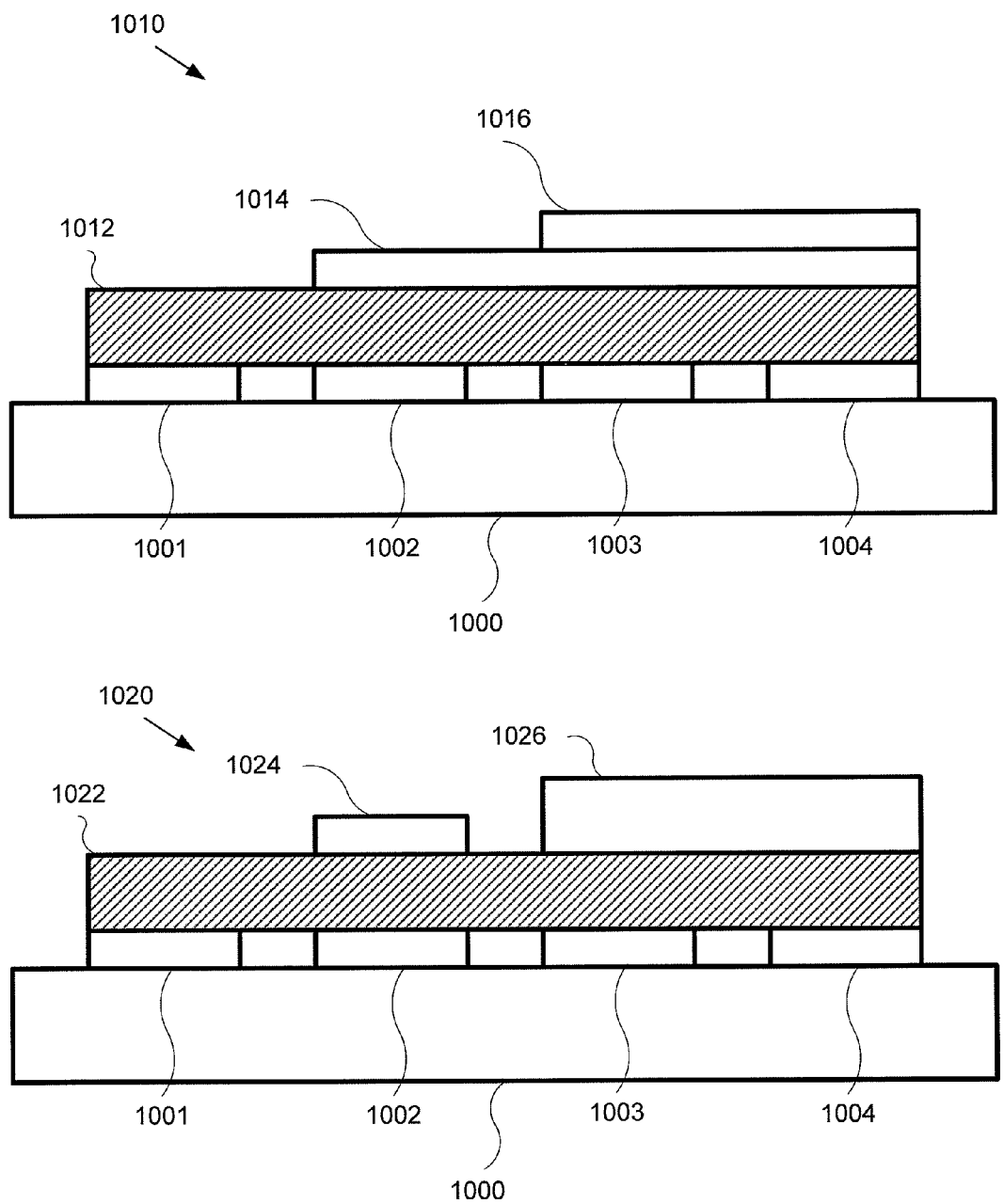
FIG. 10 shows portions of quad pixel architectures.

FIG. 10 shows portions of quad pixel architectures. FIG. 10 specifically shows a part of the first organic stack for each of four subpixels that may be different for each OLED. Preferably, all other parts of the first organic stack are the same for every OLED, and do not require any fine alignments to deposit. A substrate 1000 has first, second, third and fourth areas 1001, 1002, 1003 and 1004 over which first, second, third and fourth OLEDs, respectively, may be fabricated. FIG. 10 does not show parts of the OLEDs other than a part of the first organic stacks, such as first and second electrodes, an emissive stack, a second organic stack, or the remainder of the first organic stack. The parts of first organic stacks as illustrated in FIG. 10 may be incorporated into a variety of OLED configurations, such as those shown in FIG. 7.

Configuration 1010 shows an architecture where a part of the first organic stack for each of four subpixels may be different for the first and second OLEDs, but are the same for the third and fourth OLEDs. Configuration 1010 may be achieved using one deposition without a fine alignment to deposit layer 1012, and two depositions with a fine alignment to deposit layers 1014 and 1016. Layers 1012, 1014 and 1016 may be the same material or blend of materials, or may include different materials or blends of materials. Preferably, layers 1012, 1014 and 1016 are the same material, and the fine alignment deposition steps are used to tune thickness to achieve a desired and separately tunable microcavity dimension for each of the first second and third OLEDs, where the thickness of the layers illustrated in FIG. 10 are the same for the third and fourth OLEDs.

Configuration 1020 shows an architecture where a part of the first organic stack for each of four subpixels may be different for the first and second OLEDs, but are the same for the third and fourth OLEDs. Configuration 1020 may be achieved using one deposition without a fine alignment to deposit layer 1022, and two depositions with a fine alignment to deposit layers 1024 and 1026. Layers 1022, 1024 and 1026 may be the same material or blend of materials, or may include different materials or blends of materials: Preferably, layers 1022, 1024 and 1026 are the same material, and the fine alignment deposition steps are used to tune thickness to achieve a desired and separately tunable microcavity dimension for each of the first second and third OLEDs, where the thickness of the layers illustrated in FIG. 10 are the same for the third and fourth OLEDs.

Preferably, layers 1012, 1014 and 1016 together form the transport layers (HTL or ETL) of the first organic stack of each of the first, second, third and fourth OLEDs. Thus, the thickness of the transport layer of a particular OLED may be tuned depending upon which of layers 1012, 1014 and 1016 are present in the particular OLED. Any other layers of the first organic stack of the OLEDs are preferably the same across all OLEDs in the quad pixel, such that fine alignments are not needed to deposit the layers. Similar considerations apply to the corresponding layers of configuration 1020.

The configurations of FIG. 10, when compared to those of FIG. 9, have two significant differences. First, the thickness and materials of the illustrated layers for the third and fourth OLEDs may be different in the configurations of FIG. 9, but are the same in the configurations of FIG. 10. Second, in order to deposit the layers illustrated in FIG. 9, one deposition without fine alignment and three depositions with fine alignments are needed. But in order to deposit the layers illustrated in FIG. 10, only one deposition without fine alignment and two depositions with fine alignments are needed.

Figure 11:
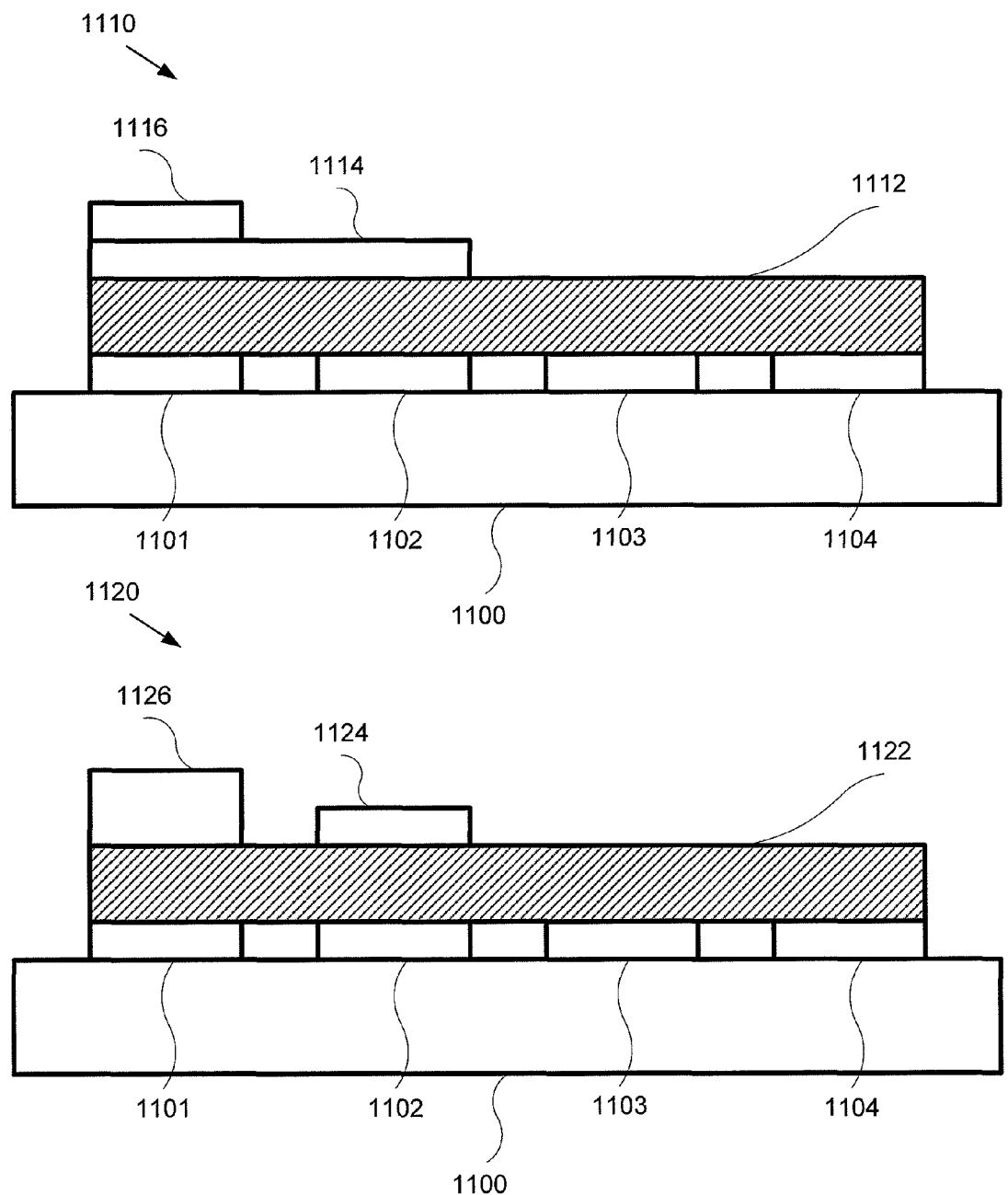
FIG. 11 shows portions of quad pixel architectures.

FIG. 11 shows additional configurations 1110 and 1120 that are similar to the configurations of FIG. 10 in that the thickness and materials of the illustrated layers for the third and fourth OLEDs are the same, and that only one deposition without fine alignment and two depositions with fine alignments are needed. Configuration 1110 includes layer 1112 that may be deposited without fine alignment of a mask, and layers 1114 and 1116 that are deposited with fine alignment of a mask. Similarly, configuration 1120 includes layer 1122 that may be deposited without fine alignment of a mask, and layers 1124 and 1126 that are deposited with fine alignment of a mask. Configurations 1110 and 1120 are different from configurations 1010 and 1020 in that, for configurations 1110 and 1120, there are less layers deposited over third and fourth areas 1103 and 1104 as opposed to more layers deposited over third and fourth areas 1003 and 1004.

FIG. 11 shows portions of quad pixel architectures. A substrate 1100 has first, second, third and fourth areas 1101, 1102, 1103 and 1104 over which first, second, third and fourth OLEDs, respectively, may be fabricated. FIG. 11 does not show parts of the OLEDs other than a part of the first organic stacks, such as first and second electrodes, an emissive stack, a second organic stack, or the remainder of the first organic stack. The parts of first organic stacks as illustrated in FIG. 11 may be incorporated into a variety of OLED configurations, such as those shown in FIG. 7.

Other configurations for quad pixels that are variations on the configurations of FIGS. 10 and 11 should be apparent to those of skill in the art based on the disclosure herein. These variations may involve a subset of layers separately tunable for three of the four OLEDs using one deposition without fine alignment and two depositions with fine alignments.

Figure 12:
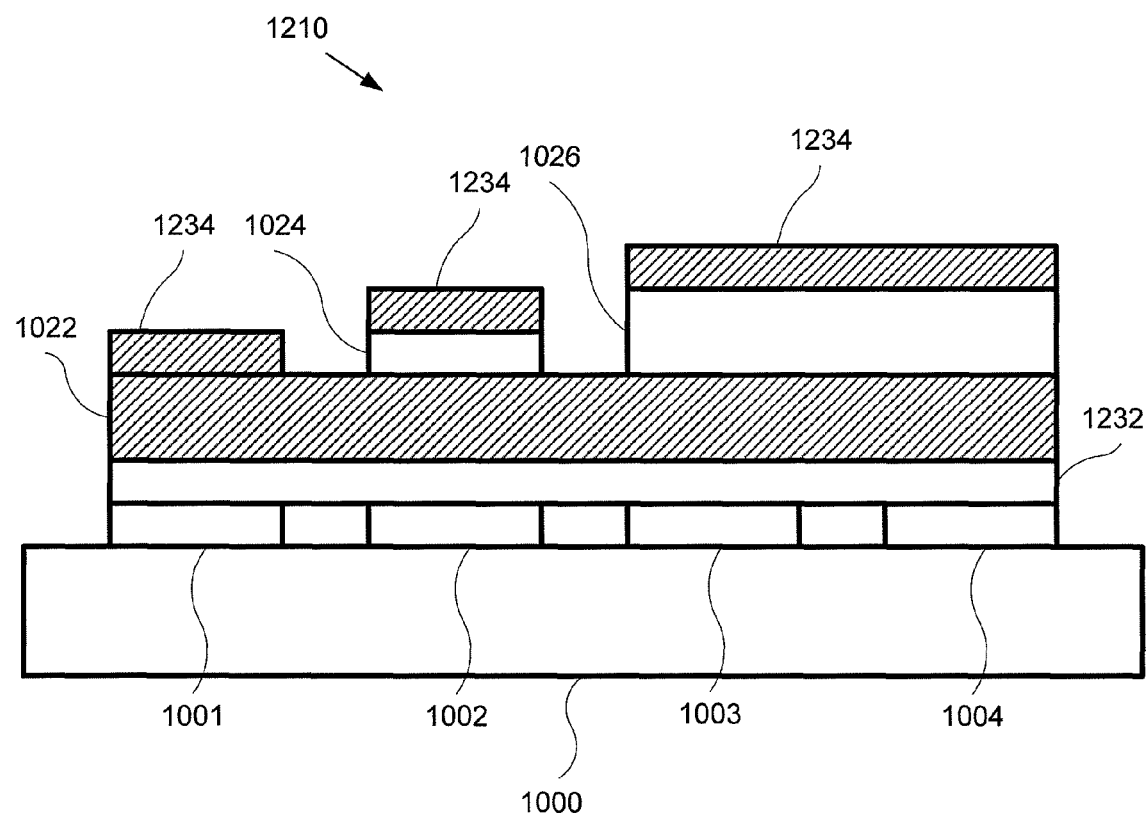
FIG. 12 shows portions of quad pixel architectures.

FIG. 12 shows configuration 1210, an example of a first organic stack for each of four OLEDs in a quad pixel architecture that includes an HTL having configuration 1020. Substrate 1000 and first, second, third and fourth areas 1001, 1002, 1003 and 1004 are labeled consistently with FIG. 10. Layers 1022, 1024 and 1026 are also labeled consistently with FIG. 10. For example, layers 1022, 1024 and 1026 may collectively form the HTLs of the first, second, third and fourth OLEDs. Layer 1232 may be a hole injection layer common to all OLEDs, and layer 1234 may be a blocking layer common to all OLEDs. Layers 1232 and 1234, common to all OLEDs, may be deposited without fine alignment of a mask. Collectively, layers 1022, 1024, 1026, 1232 and 1234 form the "first organic stack" of the OLEDs in a quad pixel architecture having configuration 1210. The OLEDs may also have other layers, such as first and second electrodes, organic emissive stacks, and second organic stacks.

Figure 13:
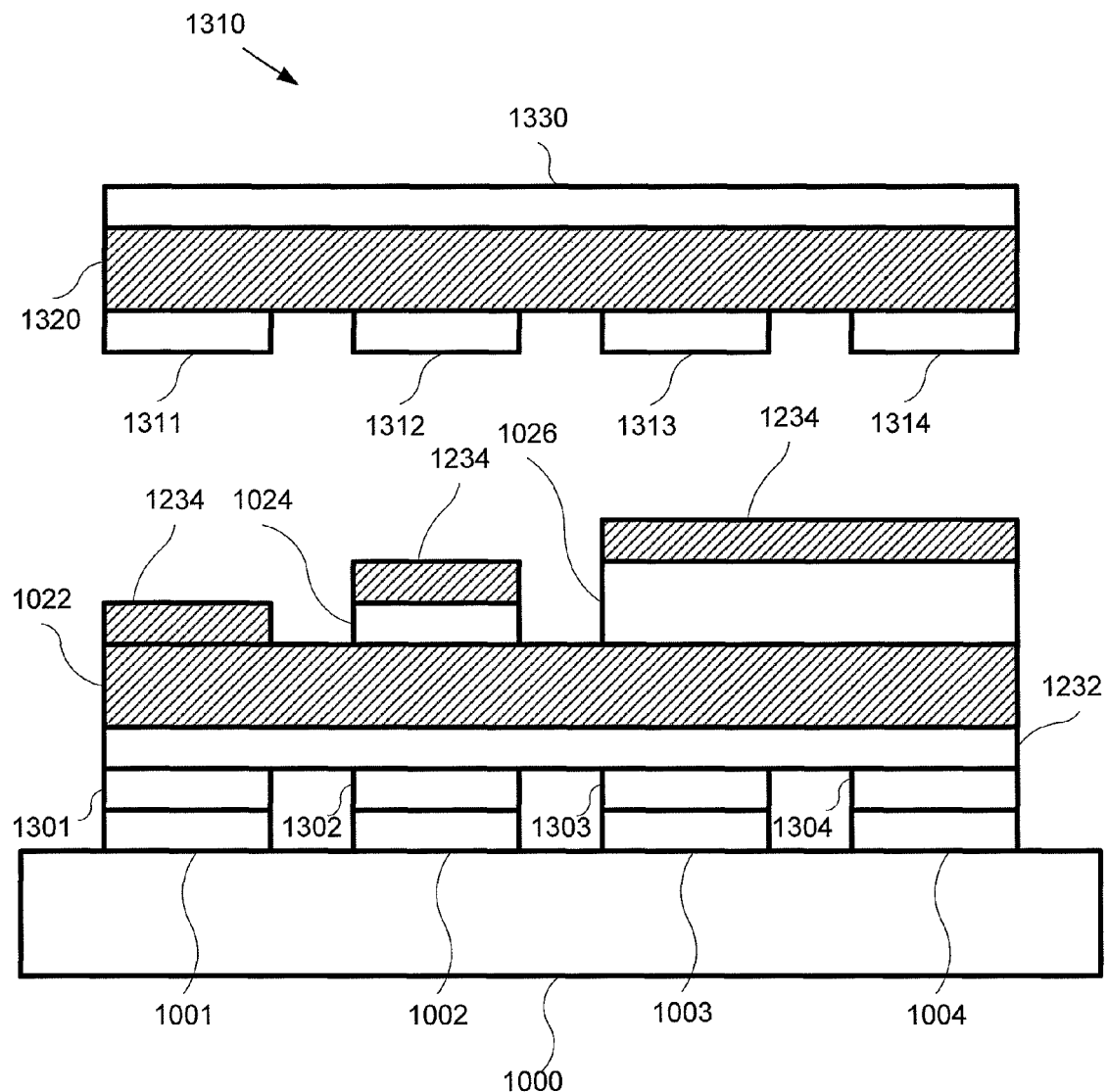
FIG. 13 shows a quad pixel architecture.

FIG. 13 shows configuration 1310, an example of a quad pixel architecture that includes HTLs having configuration 1020. Substrate 1000 and first, second, third and fourth areas 1001, 1002, 1003 and 1004 are labeled consistently with FIGS. 10 and 12. Layers 1022, 1024 and 1026 are also labeled consistently with FIGS. 10 and 12. Layers 1232 and 1234 are labeled consistently with FIG. 12. Configuration 1310 also shows first electrodes 1301, 1302, 1303 and 1304, respectively, for each of the first, second, third and fourth OLEDs. Organic emissive stacks 1311, 1312, 1313 and 1314, are also shown for each of the first, second, third and fourth OLEDs, respectively, as well as a second organic stack 1320 and a second electrode 1330 common to all OLEDs. In FIG. 13 and other figures herein, the structures may be drawn with the goals of clarity of illustration and ease of understanding, and may not exactly correspond to the structure of an actual device. For example, layer 1234 is deposited without a finely aligned mask and is deposited over the entire area of the quad pixel, but for clarity of illustration layer 1234 is not shown in the regions between areas 1001, 1002, 1003 and 1004. Also for example, organic emissive stacks 1311, 1312, 1313 and 1314 may touch layer 1234 in an actual device, but for ease of labeling the illustration shows a gap.

Figure 14:
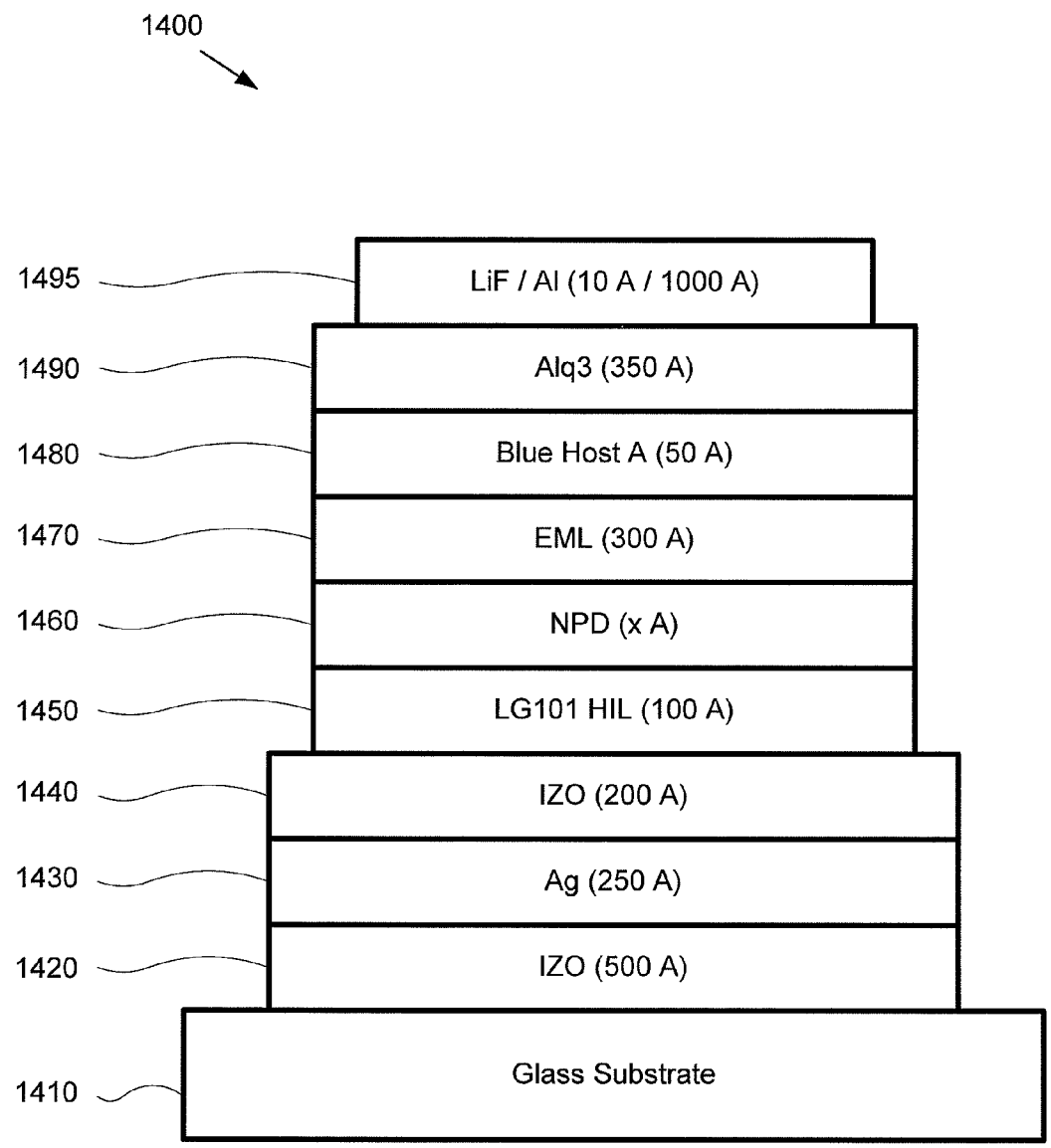
FIG. 14 shows a blue microcavity OLED with variable thickness in the hole transport layer.

FIG. 14 shows the structure of an OLED 1400 device that was fabricated in order to measure microcavity effects. OLED 1400 was fabricated on a glass substrate 1410 having a thickness 0.7 nm, onto which a semi-reflective anode stack was deposited. The anode includes layers 1420, 1430 and 1440, which are 500 Å IZO (indium zinc oxide)/250 Å Ag (silver)/200 Å IZO, respectively. The anode was first patterned and then an active pixel area (2 mm$^2$) was defined using a polyimide grid. The substrate was loaded into a VTE (vacuum thermal evaporation) chamber and the following organic layers were deposited: a LG101 (commercially available from LG Chem. Ltd., Korea) hole-injection layer 1450 (HIL) (100 Å), followed by a HTL layer 1460 of NPD (N,N'-di-[(1-naphthalenyl)-N,N'-diphenyl]-(1,1'-biphenyl)-4,4'-diamine) of thickness 800 Å to 1200 Å in 50 Å intervals (such that 9 devices were grown with the only difference being HTL thickness), followed by an EML layer 1470 of thickness 300 Å of either: (a) [Light Blue Devices] Blue Host A doped with 22% wt. Blue Dopant A, or (b) [Blue Devices] Blue Host A doped with 18% wt. Blue Dopant B. This was followed by a blocking layer 1480 (BL) of Blue Host A (50 Å). An ETL layer 1490 of Alq$_3$ (tris-(8-quinolinolato)aluminum) was then deposited to a thickness of 350 Å. Finally, a cathode structure 1495 of LiF (10 Å) followed by Al (1000 Å) was deposited, and the devices were encapsulated. The structures of chemicals used in the device include:

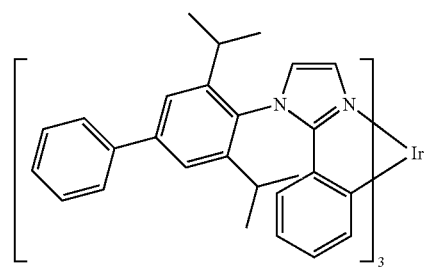

Blue dopant A

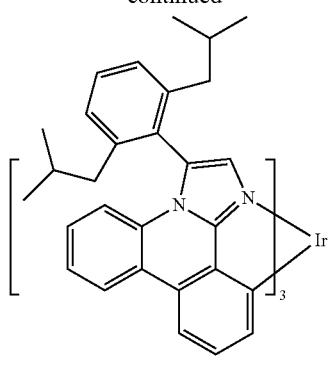

Blue dopant B

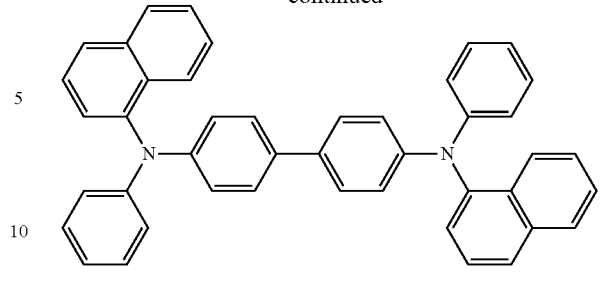

NPD

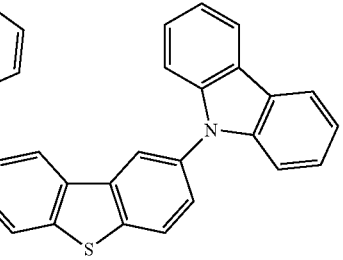

Blue Host A

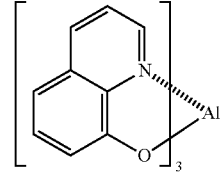

Alq₃

R, G, B1 and B2 bottom emission (BE) microcavity OLED pixels were fabricated using device stacks that were identical except for thickness of the HTL layer, and the different materials used in the EML, as illustrated in FIG. 14. A summary of device performance is shown for light blue (B1) and blue (B2) in Tables 2 and 3.

TABLE 2

Light blue (B1) BE microcavity pixel data.

| | Light Blue (B1) | | | | | | | | |
|---|---|---|---|---|---|---|---|---|---|
| | 1931 CIE | | $\lambda_{max}$ | FWHM | Voltage | At 1000 nits | | PE | cd/A per |
| Host/BL | x | y | [nm] | [nm] | [V] | LE [cd/A] | EQE [%] | [lm/W] | CIE y |
| 1200A | 0.113 | 0.156 | 474 | 16 | 6.2 | 21.9 | 21.0 | 11.1 | 140.4 |
| 1150A | 0.115 | 0.148 | 474 | 14 | 6.3 | 20.3 | 20.0 | 10.0 | 137.0 |
| 1100A | 0.127 | 0.133 | 470 | 16 | 6.8 | 12.0 | 11.9 | 5.5 | 90.4 |
| 1050A | 0.132 | 0.149 | 468 | 20 | 7.2 | 8.8 | 7.8 | 3.8 | 58.9 |
| 1000A | 0.133 | 0.157 | 468 | 20 | 7.4 | 8.0 | 6.8 | 3.4 | 50.9 |
| 950A | 0.141 | 0.209 | 470 | 22 | 7.8 | 5.6 | 3.8 | 2.2 | 26.9 |
| 900A | 0.151 | 0.256 | 472 | 24 | 8.0 | 4.6 | 2.8 | 1.8 | 18.0 |
| 850A | 0.156 | 0.272 | 472 | 26 | 8.1 | 4.4 | 2.5 | 1.7 | 16.2 |
| 800A | 0.173 | 0.318 | 472 | 42 | 8.3 | 4.0 | 2.1 | 1.5 | 12.6 |

TABLE 3

Blue (B or B2) BE microcavity pixel data.

| | Blue (B or B2) | | | | | | | | |
|---|---|---|---|---|---|---|---|---|---|
| | 1931 CIE | | $\lambda_{max}$ | FWHM | Voltage | At 1000 nits | | PE | cd/A per |
| HTL Thickness | x | y | [nm] | [nm] | [V] | LE [cd/A] | EQE [%] | [lm/W] | CIE y |
| 1200A | 0.126 | 0.095 | 468 | 18 | 7.0 | 10.0 | 12.7 | 4.5 | 105.7 |
| 1150A | 0.129 | 0.084 | 466 | 18 | 7.2 | 9.4 | 12.9 | 4.1 | 111.6 |
| 1100A | 0.140 | 0.064 | 460 | 14 | 7.8 | 6.0 | 9.3 | 2.4 | 93.2 |

TABLE 3-continued

Blue (B or B2) BE microcavity pixel data.

| | Blue (B or B2) | | | | | | | | |
|---|---|---|---|---|---|---|---|---|---|
| | | | | | At 1000 nits | | | | |
| | 1931 CIE | | $\lambda_{max}$ | FWHM | Voltage | | | PE | cd/A per |
| HTL Thickness | x | y | [nm] | [nm] | [V] | LE [cd/A] | EQE [%] | [lm/W] | CIE y |
| 1050A | 0.143 | 0.067 | 458 | 14 | 8.2 | 4.6 | 6.9 | 1.7 | 68.2 |
| 1000A | 0.144 | 0.071 | 458 | 16 | 8.6 | 3.9 | 5.6 | 1.4 | 54.7 |
| 950A | 0.145 | 0.100 | 458 | 20 | 9.3 | 2.4 | 2.7 | 0.8 | 24.0 |
| 900A | 0.148 | 0.127 | 460 | 20 | 9.6 | 2.0 | 1.9 | 0.6 | 15.8 |
| 850A | 0.149 | 0.140 | 460 | 20 | 9.8 | 1.9 | 1.6 | 0.6 | 13.6 |
| 800A | 0.158 | 0.181 | 460 | 24 | 9.8 | 1.7 | 1.3 | 0.5 | 9.4 |

Here a unit of luminous efficiency (cd/A) divided by 1931 CIE y is used to compare efficiencies at different color saturations. This approximately accounts for the fall off in luminous efficiency for deeper blue colors where the photopic response of the eye is weakest. As can be seen from Table 1, this is optimized at 1150 A HTL thickness for B1. As can be seen for Table 2, the optimized HTL thickness for B2 is also 1150 A. Although the optimized HTL thicknesses are the same in this particular experiment, it is generally expected that for B1 and B2 devices, the optimized HTL thicknesses will be different, but by a small amount.

In an RGB1B2 display, the saturated blue B2 sub-pixel is used infrequently compared to the B1 sub-pixel. It is estimated that in rendering typical images, the B2 sub-pixel will account for only approximately 2% of the power consumption of an RGB1B2 display, while the B1 sub-pixel will account for approximately 47% of the power consumption (see Woo-Young So. et al., SID 2010 for more details). It is proposed that the HTL thickness for B1 and B2 sub-pixels be optimized for B1 (in this case 1150 A thickness) and that the same thickness should then also be used for B2. B1 and B2 HTL layers can then be deposited in a single step through a common mask, thereby reducing manufacturing costs.

Even if the B2 sub-pixel would then not be optimized, increase in power consumption is expected to be minimal due to the relatively infrequent use of the B2 sub-pixel. For example, even if efficiency was reduced by 20%, this would lead to only a 2%×0.2=0.4% increase in RGB1B2 panel consumption. This slight rise in power consumption is expected to be more than off-set by the reduced cost of using common B1 and B2 HTL thickness. Additionally, the B2 microcavity could be re-optimized by altering the thickness of the B2 EML during deposition of this layer. This approach of tuning the microcavity by altering the EML layer thickness is described in Jpn. J. of Appl. Phys., Vol. 45, No. 5B (2006)—Ishibashi et at. This approach can be effective if small changes in EML thickness are required, but can lead to substantial loss of luminous efficiency, higher voltage and/or reduced device lifetime if significant changes in EML thickness are required.

This unexpected result arises because the peak wavelengths of B1 and B2 are very close: B1 peaks at 474, while B2 peaks at 466 nm. This means that the total organic layer thicknesses required for optimized B1 and B2 microcavities are very similar. In comparison, an equivalent optimized red device would have peak emission wavelength at 612 nm, requiring HTL thickness 1950 A, while an equivalent optimized green device would have peak emission wavelength at 528 nm, requiring HTL thickness 1450 A. The total organic layer thicknesses needed for optimized R, G and B (or B2) microcavity devices are therefore very different, so a common HTL thickness is preferably not used unless the thicknesses of individual EML layers are substantially altered (see Jpn. J. of Appl. Phys., Vol. 45, No. 5B (2006)—Ishibashi et al.) which can lead to significant loss in luminous efficiency, higher voltage and/or reduced device lifetime, as well as possibly additional depositions requiring fine alignment. This loss in performance is avoided in embodiments disclosed herein.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device comprising a quad pixel, the quad pixel comprising:
   a first OLED, a second OLED, a third OLED and a fourth OLED, each OLED independently having:
      a first electrode;
      a second electrode;
      an organic emissive stack having an emitting material, disposed between the first and second electrodes;
      a first organic stack disposed between and in contact with the first electrode and the organic emissive stack;
      a second organic stack disposed between and in contact with the second electrode and the organic emissive stack;
   wherein:
      the organic emissive stack of the first OLED, the organic emissive stack of the second OLED, the organic emissive stack of the third OLED, and the organic emissive stack of the fourth OLED each have different emissive spectra;
      the first organic stack of the first OLED, the first organic stack of the second OLED, and the first organic stack of the third OLED are different from each other in materials or thickness, or both; and
      the first organic stack of the third OLED and the first organic stack of the fourth OLED are the same.

2. The device of claim 1, wherein the first electrode is an anode and the OLED is a bottom emitting OLED for each of the first OLED, the second OLED, the third OLED and the fourth OLED.

3. The device of claim 1, wherein the first electrode is an anode and the OLED is a top emitting OLED for each of the first OLED, the second OLED, the third OLED and the fourth OLED.

4. The device of claim 1, wherein the first electrode is a cathode and the OLED is a bottom emitting OLED for each of the first OLED, the second OLED, the third OLED and the fourth OLED.

5. The device of claim 1, wherein the first electrode is a cathode and the OLED is a top emitting OLED for each of the first OLED, the second OLED, the third OLED and the fourth OLED.

6. The device of claim 1, wherein the second organic stack is the same in each of the first OLED, the second OLED, the third OLED and the fourth OLED.

7. The device of claim 1, wherein the second organic stack is different in each of the first OLED, the second OLED, the third OLED and the fourth OLED.

8. The device of claim 1, wherein:
each of the first, second, third and fourth OLEDs has a single emissive material, different from the emissive material of each of the other OLEDs;
the emitting material of the first OLED emits light having a peak wavelength in the visible spectrum of 600-700 nm, and is a phosphorescent material;
the emitting material of the second OLED emits light having a peak wavelength in the visible spectrum of 500-600 nm, and is a phosphorescent material;
the emitting material of the third OLED emits light having a peak wavelength in the visible spectrum of 400-500 nm; and
the emitting material of the fourth OLED emits light having a peak wavelength in the visible spectrum of 400-500 nm, and
the peak wavelength in the visible spectrum of light emitted by the fourth organic light emitting device is at least 4 nm less than the peak wavelength in the visible spectrum of light emitted by the third organic light emitting device.

9. The device of claim 8, wherein the emitting material of the third OLED is a phosphorescent material and the emitting material of the fourth OLED is a phosphorescent material.

10. The device of claim 8, wherein the emitting material of the third OLED is a phosphorescent material and the emitting material of the fourth OLED is a fluorescent material.

11. The device of claim 8, wherein the emitting material of the third OLED is a fluorescent material and the emitting material of the fourth OLED is a fluorescent material.

12. The device of claim 1, wherein:
each of the first, second, third and fourth OLEDs has an organic emissive stack that emits a spectrum of light different from the spectrum emitted by the organic emissive stack of each of the other OLEDs;
the organic emissive stack of the first OLED emits light having a peak wavelength in the visible spectrum of 600-700 nm, and includes a phosphorescent emitting material;
the organic emissive stack of the second OLED emits light having a peak wavelength in the visible spectrum of 500-600 nm, and includes a phosphorescent material;
the organic emissive stack of the third OLED emits light having a peak wavelength in the visible spectrum of 400-500 nm; and
the organic emissive stack of the fourth OLED emits light having a peak wavelength in the visible spectrum of 550-600 nm, and includes a phosphorescent emitting material; and
wherein the peak wavelength in the visible spectrum of light emitted by the fourth organic light emitting device is at least 10 nm greater than the peak wavelength in the visible spectrum of light emitted by the second organic light emitting device, and at least 10 nm less than the peak wavelength in the visible spectrum of light emitted by the first organic light emitting device.

13. The device of claim 1, wherein the organic emissive stack of the fourth OLED includes an organic emissive layer of the fourth OLED, and the organic emissive layer of the fourth OLED is the same as, and is deposited at the same time as, a component of either the first or second organic stacks of the first, second and third OLEDs.

14. The device of claim 1, wherein the device is a lighting panel that includes a plurality of quad pixels.

15. The device of claim 1, wherein the device is a consumer device that includes a plurality of quad pixels.

16. A method of depositing a device comprising a quad pixel:
the quad pixel comprising:
a first OLED, a second OLED, a third OLED and a fourth OLED, each OLED independently having:
an area of a substrate over which the OLED is disposed;
a first electrode;
a second electrode;
an organic emissive stack having an emitting material, disposed between the first and second electrodes;
a first organic stack disposed between and in contact with the first electrode and the emissive layer;
a second organic stack disposed between and in contact with the second electrode and the emissive layer;
wherein:
the organic emissive stack of the first OLED, the organic emissive stack of the second OLED, the organic emissive stack of the third OLED, and the organic emissive stack of the fourth OLED each have different emissive spectra;
the first organic stack of the first OLED, the first organic stack of the second OLED, and the first organic stack of the third OLED are different from each other in materials or thickness or both;
the method comprising:
depositing each component of the first organic stack of the third OLED at the same time as the same component in the first organic stack of the fourth OLED.

17. The method of claim 16, wherein, during the deposition of the first organic stacks of the first, second, third and fourth OLEDs, there are at most two alignments of masks that allow deposition over some but not all of the areas of the first, second, third and fourth OLEDs, and the deposition of one or more components of the first organic stack of some but not all of the first, second, third and fourth OLEDs through each of the masks.

18. The method of claim 16, wherein, during the deposition of the quad pixel, there are at most six alignments of masks that allow deposition over some but not all of the areas of the first, second, third and fourth OLEDs, and the deposition of one or more components of the first, second, third and fourth OLEDs through each of the masks.

19. The method of claim 17, wherein, during the deposition of the first organic stacks of the first, second, third and fourth OLEDs, there are exactly two alignments of masks that allow deposition over some but not all of the first, second, third and fourth OLEDs, and the deposition of one or more components of the first organic stack of some but not all of the first, second, third and fourth OLEDs through each of the masks.

20. The method of claim 19, wherein, during the deposition of the first organic stacks of the first, second, third and fourth OLEDs, and prior to the deposition through two masks that allow deposition over some but not all of the first, second, third and fourth OLEDs, there is a deposition of one or more components of the first organic stacks of the first, second, third and fourth OLEDs.

21. The method of claim 20, wherein, during the deposition of the first organic stacks of the first, second, third and fourth OLEDs, and after the deposition through two masks that allow deposition over some but not all of the first, second, third and fourth OLEDs, there is a deposition of one or more components of the first organic stacks of the first, second, third and fourth OLEDs.

22. The method of claim 16, further comprising:
depositing over the area of each of the first, second, third and fourth OLEDs, one or more components of the first organic stack of each of the first, second, third and fourth OLEDs;
aligning a mask that allows for deposition over the area of the second OLED and not the areas of the first, third and fourth OLEDs, and depositing through the mask over the area of the second OLED and not over the area of the first, third and fourth OLEDs, one or more components of the first organic stack of the second OLED;
aligning a mask that allows for deposition over the area of the third and fourth OLEDs and not the areas of the first and second OLEDs, and depositing through the mask over the area of the third and fourth OLEDs and not over the area of the first and second OLEDs, one or more components of the first organic stack of the third and fourth OLEDs.

23. The method of claim 22, wherein the steps described in claim 21 are performed in the order described.

24. The method of claim 22, wherein the steps described in claim 21 are performed in an order different from the order described.

25. The method of claim 16, further comprising:
depositing over the area of each of the first, second, third and fourth OLEDs, one or more components of the first organic stack of each of the first, second, third and fourth OLEDs;
aligning a mask that allows for deposition over the area of the second, third and fourth OLEDs and not the areas of the first OLED, and depositing through the mask over the area of the second, third and fourth OLEDs and not over the area of the first OLED, one or more components of the first organic stack of the second, third and fourth OLEDs;
aligning a mask that allows for deposition over the area of the third and fourth OLEDs and not the areas of the first and second OLEDs, and depositing through the mask over the area of the third and fourth OLEDs and not over the area of the first and second OLEDs, one or more components of the first organic stack of the third and fourth OLEDs.

26. The method of claim 16, further comprising:
depositing over the area of each of the first, second, third and fourth OLEDs, one or more components of the first organic stack of each of the first, second, third and fourth OLEDs;
aligning a mask that allows for deposition over the area of the first and second OLEDs and not the areas of the third and fourth OLEDs, and depositing through the mask over the area of the first and second OLEDs and not over the area of the third and fourth OLEDs, one or more components of the first organic stack of the first and second OLEDs;
aligning a mask that allows for deposition over the area of the first OLED and not the areas of the second, third and fourth OLEDs, and depositing through the mask over the area of the first OLED and not over the area of the second, third and fourth OLEDs, one or more components of the first organic stack of the first OLED.

27. The method of claim 16, further comprising:
depositing over the area of each of the first, second, third and fourth OLEDs, one or more components of the first organic stack of each of the first, second, third and fourth OLEDs;
aligning a mask that allows for deposition over the area of the first OLED and not the areas of the second, third and fourth OLEDs, and depositing through the mask over the area of the first OLED and not over the area of the second, third and fourth OLEDs, one or more components of the first organic stack of the first OLED;
aligning a mask that allows for deposition over the area of the second OLED and not the areas of the first, third and fourth OLEDs, and depositing through the mask over the area of the second OLED and not over the area of the first, third and fourth OLEDs, one or more components of the first organic stack of the first OLED.

28. The method of claim 16, wherein for each of the first OLED, the second OLED, the third OLED and the fourth OLED:
the first electrode is an anode;
the second electrode is a cathode, and
the OLED is a bottom emitting OLED;
wherein the method further comprises:
providing over the substrate the first electrode of each of the first, second, third and fourth OLEDs;
for each of the first, second, third and fourth OLEDs, depositing over the first electrode a first organic stack;
for each of the first, second, third and fourth OLEDs, depositing over the first organic stack an emissive stack;
for each of the first, second, third and fourth OLEDs, depositing over the emissive stack a second organic stack;
for each of the first, second, third and fourth OLEDs, depositing over the second organic stack a second electrode.

29. The method of claim 28, wherein depositing the first organic stack includes, for each of the first, second, third and fourth OLEDs, depositing in order:
a hole injection layer; and
a hole transport layer;
wherein the hole injection layer for each of the first, second, third and fourth OLEDs are deposited at the same time, and wherein multiple steps and different masks are used to deposit hole transport layers that are different for the first, second and third OLEDs, and wherein the hole transport layers of the third and fourth OLEDs are deposited at the same time.

30. The method of claim 29, wherein the emissive stack of each of the first, second, third and fourth OLEDs is deposited through a different mask and have different material compositions.

31. The method of claim 30, wherein the emissive stack of at least one of the first, second, third and fourth OLEDs includes an emissive layer having a host and a dopant, and a blocking layer having the host and not the dopant.

32. The method of claim 31, wherein depositing the second organic stack includes, for each of the first, second, third and fourth OLEDs, depositing in order:
- an electron transport layer; and
- an electron injection layer;
- wherein the electron injection layer for each of the first, second, third and fourth OLEDs are deposited at the same time, and wherein the electron transport layers for each of the first, second, third and fourth OLEDs are deposited at the same time.

33. The method of claim 30, wherein each layer of the second organic stack of each of the first, second, third and fourth OLEDs is deposited at the same time through the same mask.

34. The method of claim 30, wherein deposition of the second organic stack includes depositing an electron transport layer.

35. The method of claim 30, wherein depositing the second organic stack includes, for each of the first, second, third and fourth OLEDs, depositing in order:
- a blocking layer;
- an electron transport layer; and
- an electron injection layer;
- wherein the blocking layer for each of the first, second, third and fourth OLEDs are deposited at the same time, and the electron injection layer for each of the first, second, third and fourth OLEDs are deposited at the same time, and wherein multiple steps and different masks are used to deposit electron transport layers that are different for the first, second and third OLEDs, and wherein the electron transport layers of the third and fourth OLEDs are deposited at the same time.

* * * * *